(12) United States Patent
Kim

(10) Patent No.: US 8,604,697 B2
(45) Date of Patent: Dec. 10, 2013

(54) APPARATUS FOR GENERATING PLASMA

(75) Inventor: Hongseub Kim, Suwon-si (KR)

(73) Assignee: Jehara Corporation, Suwon-si (KR)

(*) Notice: Subject to any disclaimer, the term of this patent is extended or adjusted under 35 U.S.C. 154(b) by 502 days.

(21) Appl. No.: 12/941,234

(22) Filed: Nov. 8, 2010

(65) Prior Publication Data
US 2011/0133650 A1    Jun. 9, 2011

(30) Foreign Application Priority Data

Dec. 9, 2009 (KR) .................. 10-2009-0121501
Jun. 23, 2010 (KR) .................. 10-2010-0059372

(51) Int. Cl.
*H01J 7/24* (2006.01)
*H05B 31/26* (2006.01)
*C23F 1/00* (2006.01)
*C03C 15/00* (2006.01)
*C03C 25/68* (2006.01)
*H01L 21/306* (2006.01)

(52) U.S. Cl.
USPC .................. 315/111.21; 156/345.34; 216/67

(58) Field of Classification Search
None
See application file for complete search history.

(56) References Cited

U.S. PATENT DOCUMENTS

| | | | | |
|---|---|---|---|---|
| 5,614,055 A | * | 3/1997 | Fairbairn et al. | 156/345.33 |
| 5,888,414 A | * | 3/1999 | Collins et al. | 216/68 |
| 6,818,140 B2 | * | 11/2004 | Ding | 216/67 |
| 2009/0294063 A1 | * | 12/2009 | Hayashi et al. | 156/345.28 |

FOREIGN PATENT DOCUMENTS

| | | |
|---|---|---|
| JP | 10-172792 | 6/1998 |
| JP | 2006-216605 | 8/2006 |
| KR | 10-2005-0007624 | 1/2005 |
| KR | 10-2005-0011349 | 1/2005 |
| KR | 10-2006-0024690 | 3/2006 |
| WO | WO 2008/143405 | 11/2008 |

* cited by examiner

*Primary Examiner* — Douglas W Owens
*Assistant Examiner* — Dedei K Hammond
(74) *Attorney, Agent, or Firm* — NSIP Law

(57) ABSTRACT

An apparatus for generating plasma is provided. The apparatus may include a vacuum chamber and a plasma source part. The plasma source part may include a dielectric part, an upper electrode, and an inductive coil. The dielectric part may be installed to protrude upward along a circumference of a through-hole provided at a top of the vacuum chamber. The upper electrode may be coupled to seal an opened top of the dielectric part. The inductive coil may spirally extend along an outer circumference surface of the dielectric part.

18 Claims, 25 Drawing Sheets

APPARATUS FOR GENERATING PLASMA

CROSS-REFERENCE TO RELATED APPLICATIONS

This application claims the benefit under 35 U.S.C. §119 (a) of Korean Patent Application No. 10-2009-0121501, filed on Dec. 9, 2009; and No. 10-2010-0059372, filed on Jun. 23, 2010; in the Korean Intellectual Property Office, the entire disclosure of each of which is incorporated herein by reference for all purposes.

BACKGROUND

1. Field

The following description relates to an apparatus for generating plasma; more particularly, to an apparatus for generating plasma, including an upper electrode and an inductive coil.

2. Description of the Related Art

Generally, an apparatus for generating plasma is an apparatus for dissociating a reaction gas using an electromagnetic field, thereby generating free electrons, positive ions, neutral atoms, neutral molecules, etc.

FIG. 1 is a schematic cross section of an apparatus for generating plasma according to the conventional art. As one example of the conventional art, FIG. 1 illustrates an Inductively Coupled Plasma (ICP) type plasma generating apparatus 10.

The plasma generating apparatus 10 includes a vacuum chamber 11, a dielectric part 12, an inductive coil 13, a cover 14, a Radio Frequency (RF) power supply part 15, and an ElectroStatic Chuck (ESC) (or a susceptor) 16.

As illustrated in FIG. 1, the electrostatic chuck 16 is installed inside the vacuum chamber 11, and a target substrate 3 is mounted on the electrostatic chuck 16. An electrostatic chuck elevator 17 is installed below the electrostatic chuck 16. The dielectric part 12, the inductive coil 13, and the cover 14 are installed on the vacuum chamber 11, and are sealed by a case 18. A gas inlet 14a is formed at one side of the cover 14. The RF power supply part 15 includes an RF source 15a and a source matcher 15b.

When a bias RF power is applied to the electrostatic chuck 16 and an RF power is supplied to the inductive coil 6, a magnetic field 5 is formed around the inductive coil 13. In result, an electric field is induced within the vacuum chamber 11, and plasma (P) by inductive coupling is generated within the vacuum chamber 11.

The ICP type plasma generating apparatus 10 has an advantage of being capable of generating plasma of a higher density than a Capacitively Coupled Plasma (CCP) type plasma generating apparatus (not shown). Accordingly, intensive research on the ICP type plasma generating apparatus has been made.

However, because the plasma generating apparatus 10 uses only the inductive coil 13 as a means for forming an electric field within the vacuum chamber 11, the plasma generating apparatus 10 tends to non-uniformly form the electric field within the vacuum chamber 11.

As illustrated in FIG. 1, because the magnetic field 5 is intensively distributed only around the inductive coil 13, the electric field induced by the magnetic field 5 also concentrates at a lower part of the dielectric part 12. In result, a plasma density 7 is lower in a center region of the target substrate 3 than in an edge region of the target substrate 3. This phenomenon happens more seriously in a plasma generating apparatus for a large-size target substrate.

Also, because the plasma generating apparatus 10 cannot diversely vary the distribution of the electric field, it is difficult to variously control the distribution of plasma within the vacuum chamber 11.

SUMMARY

In one general aspect, there is provided an apparatus for generating plasma, the apparatus including: a vacuum chamber including a through-hole at a center of its top, and a plasma source part, including: a dielectric part configured to protrude upward along a circumference of the through-hole, an upper electrode coupled to seal an opened top of the dielectric part, the upper electrode configured to receive a supply of a Radio Frequency (RF) power, and an inductive coil configured to: spirally extend along an outer circumference surface of the dielectric part, and receive a supply of the RF power, the plasma source part being configured to generate plasma within the vacuum chamber.

In the apparatus, the through-hole may be provided in a partial region of an adaptor disposed below the dielectric part, a part of the vacuum chamber body including the adaptor.

In the apparatus: the adaptor may further include at least one additional through-hole, and the apparatus may further include: at least one additional plasma source part installed on the at least one additional through-hole, the at least one additional plasma source part including a same construction as the plasma source part, and a conductive interference prevention part configured to prevent interference between the plasma source parts.

In the apparatus, the dielectric part may include of any one of: a square pipe shape, a cylinder shape, a cone shape, and a dome shape.

In the apparatus: the plasma source part may further include a conductive connector configured to electrically connect the upper electrode with one end of the inductive coil, and the RF power supplied to the upper electrode may be configured to be supplied to the inductive coil through the conductive connector.

In the apparatus, the plasma source part may further include: at least one additional inductive coil configured to spirally extend along an outer circumference surface of the dielectric part, and at least one additional conductive connector configured to electrically connect the upper electrode with one end of the at least one additional inductive coil.

In the apparatus: the upper electrode may include a circular or polygonal plate shape antenna, and the through-hole may include a shape corresponding to the upper electrode.

The apparatus may further include an RF power supply part configured to supply the RF power to the upper electrode.

In another general aspect, there is provided an apparatus for generating plasma, the apparatus including: a vacuum chamber opened at its top, a first dielectric part including a through-hole in its partial region, the first dielectric part configured to cover the opened top of the vacuum chamber, and a plasma source part including: a second dielectric part configured to protrude upward along a circumference of the through-hole, an upper electrode coupled to seal an opened top of the second dielectric part, the upper electrode configured to receive a supply of a Radio Frequency (RF) power, a center inductive coil configured to: spirally extend along an outer circumference surface of the second dielectric part, and receive a supply of the RF power, and an edge inductive coil configured to: spirally extend along a circumference of the center inductive coil at a set distance from the center inductive coil, and receive a supply of the RF power, the plasma source part being configured to generate plasma within the vacuum chamber.

In the apparatus: the first dielectric part may further include at least one additional through-hole, and the apparatus may further include: at least one additional plasma source part installed on the at least one additional through-hole, the at least one additional plasma source part including a same construction as the plasma source part, and a conductive interference prevention part configured to prevent interference between the plasma source parts.

In the apparatus: the plasma source part may further include: a center conductive connector configured to electrically connect the upper electrode with one end of the center inductive coil, and an edge conductive connector configured to connect to one end of the edge inductive coil, and the RF power supplied to the upper electrode may be configured to be supplied to the center inductive coil through the center conductive connector.

In the apparatus, the plasma source part may further include: at least one additional center inductive coil configured to spirally extend along an outer circumference surface of the second dielectric part, at least one additional center conductive connector configured to electrically connect the upper electrode with one end of the at least one additional center inductive coil, at least one additional edge inductive coil configured to spirally extend along a circumference of the at least one additional center inductive coil at a set distance from the center inductive coil, and at least one additional edge conductive connector configured to connect to one end of the at least one additional edge inductive coil.

In the apparatus: the upper electrode may include a gas inlet configured to inject a gas, the apparatus further includes a center gas shower head installed below the upper electrode, and the center gas shower head may include: an inner gas distribution plate including a plurality of gas jet ports, and an inner gas diffusion plate disposed between the upper electrode and the inner gas distribution plate, the inner gas diffusion plate configured to uniformly diffuse the gas introduced through the gas inlet.

In the apparatus: the first dielectric part may include an opening in its partial region between the center inductive coil and the edge inductive coil, along a circumference of the second dielectric part, the apparatus may further include an edge gas shower head configured to cover the opening of the first dielectric part, and the edge gas shower head may include: a gas diffusion plate configured to uniformly diffuse a gas, a gas distribution plate formed in a "U" shape, the gas distribution plate configured to: house the gas diffusion plate, and jet the gas diffused by the gas diffusion plate into the vacuum chamber through a plurality of gas jet ports, and a cover including a gas inlet, the cover configured to cover a top of the gas distribution plate.

The apparatus may further include: a first gas controller configured to control an amount of gas introduced into the center gas shower head, and a second gas controller configured to control an amount of gas introduced into the edge gas shower head.

The apparatus may further include an RF power supply part configured to supply the RF power to the upper electrode and the edge inductive coil, wherein the RF power supply part may include: an RF source configured to generate an RF power, a source matcher connecting to an output of the RF source, the source matcher configured for impedance matching, and a variable capacitor configured to: connect between a first output of the source matcher and an edge conductive connector, and control an amount of an electric current flowing in the edge inductive coil connecting to the edge conductive connector, and wherein a second output of the source matcher may be configured to connect to an RF connection terminal of the upper electrode.

The apparatus of claim 9, may further include: a first RF power supply part configured to supply the RF power to the upper electrode, and a second RF power supply part configured to supply the RF power to the edge inductive coil.

In another general aspect, there is provided an apparatus for generating plasma, the apparatus including: a vacuum chamber opened at its top, a first dielectric part including a through-hole in its partial region, the first dielectric part configured to cover the opened top of the vacuum chamber, and a plasma source part including: a second dielectric part configured to protrude upward along a circumference of the through-hole, an upper electrode coupled to seal an opened top of the second dielectric part and grounded, a center inductive coil configured to: spirally extend along an outer circumference surface of the second dielectric part, and receive a supply of a Radio Frequency (RF) power, and an edge inductive coil configured to: spirally extend along a circumference of the center inductive coil at a set distance from the center inductive coil, and receive a supply of the RF power, the plasma source part being configured to generate plasma within the vacuum chamber.

In the apparatus: the plasma source part may further include: a center conductive connector configured to connect to one end of the center inductive coil, and an edge conductive connector configured to connect to one end of the edge inductive coil, and the center inductive coil may be grounded through the center conductive connector.

Other features and aspects may be apparent from the following detailed description, the drawings, and the claims.

Figure 1:
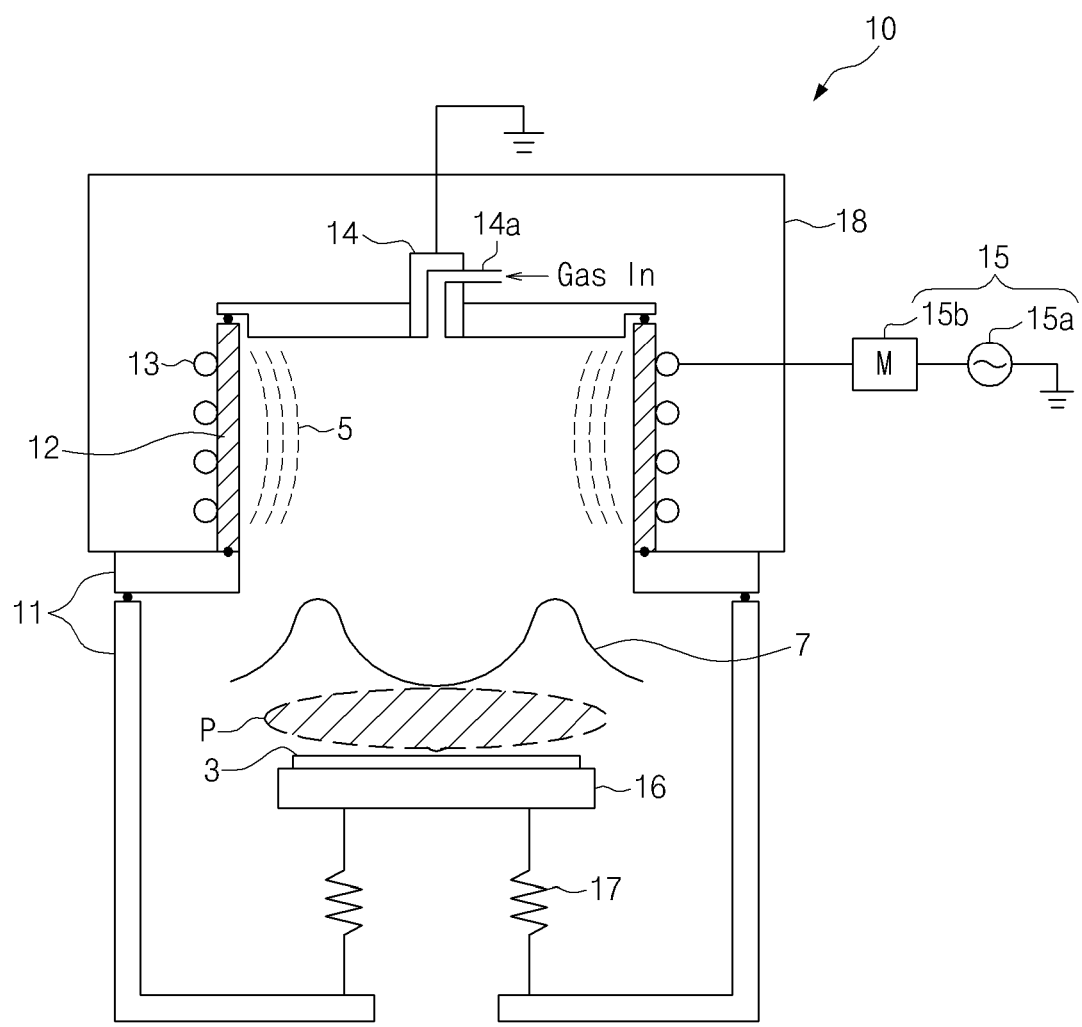
FIG. 1 is a schematic cross section of a plasma generating apparatus according to the conventional art.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Figure 2:
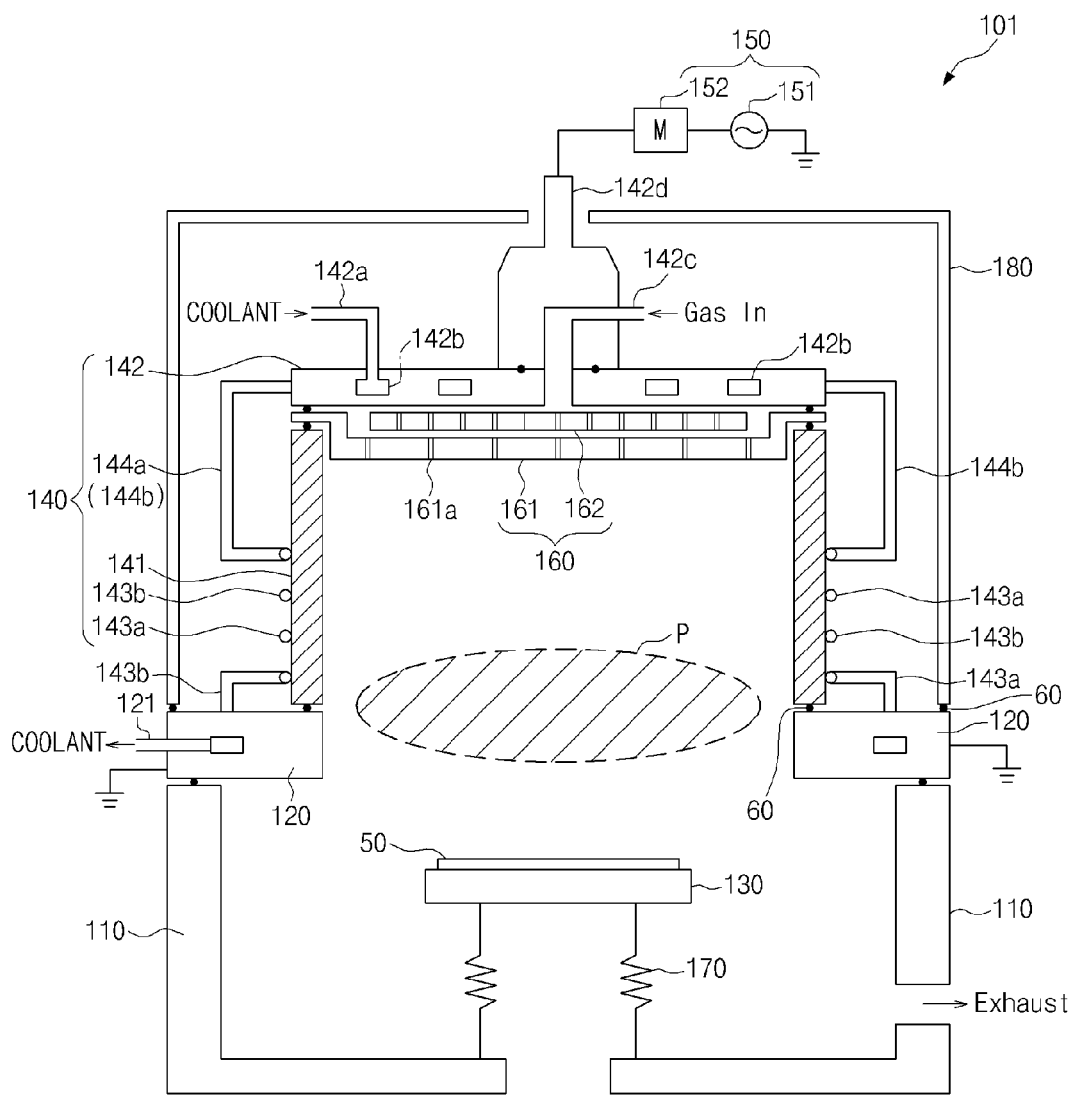
FIG. 2 is a schematic cross section of a plasma generating apparatus according to a first example embodiment.
Figure 3:
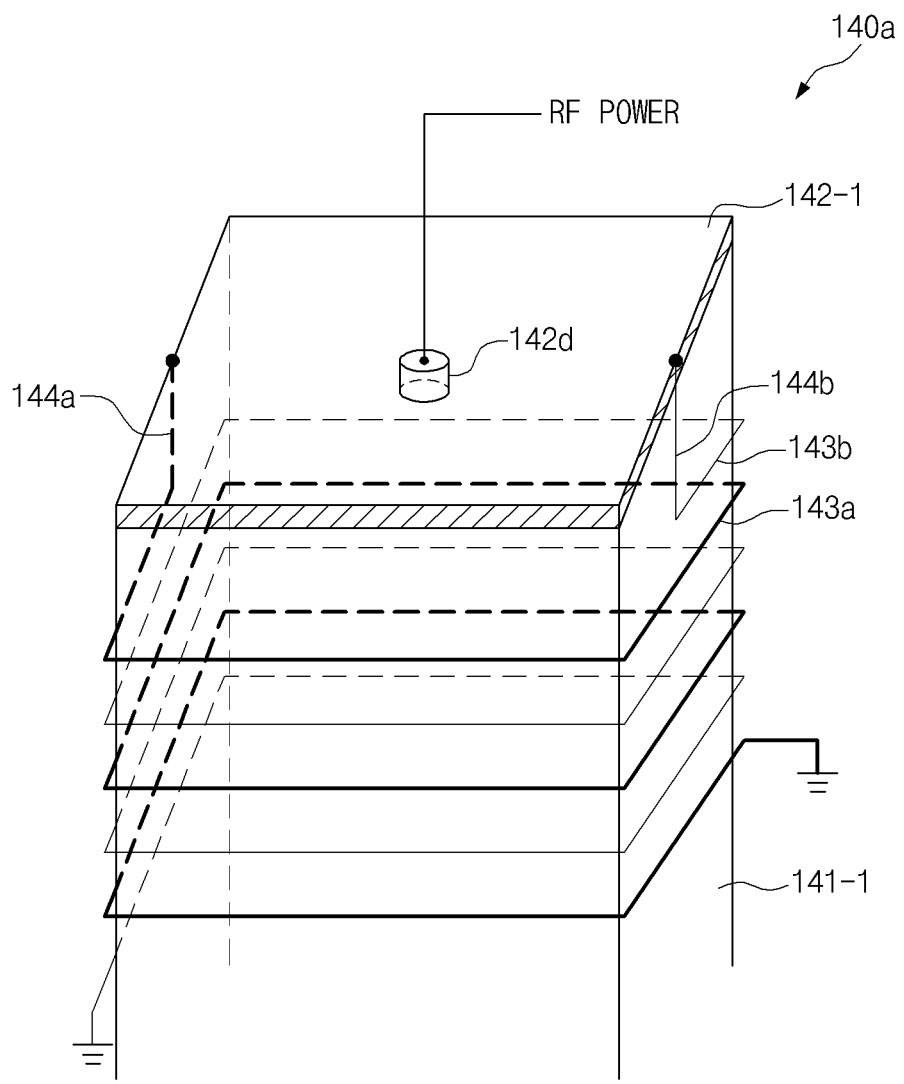
FIG. 3 is a perspective diagram of a plasma source part in an example in which a dielectric part of FIG. 2 is of a square pipe shape.
Figure 4:
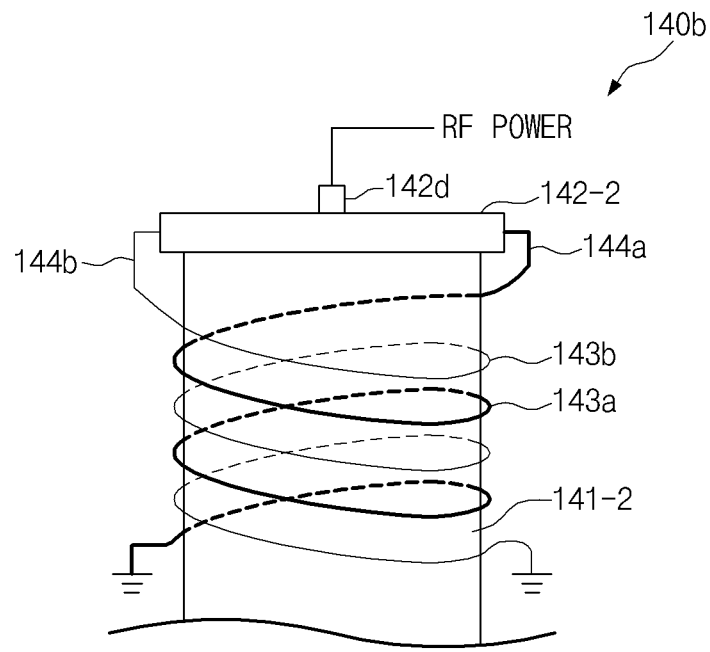
FIG. 4 is a side diagram of a plasma source part in an example in which a dielectric part of FIG. 2 is of a cylinder shape.
Figure 5:
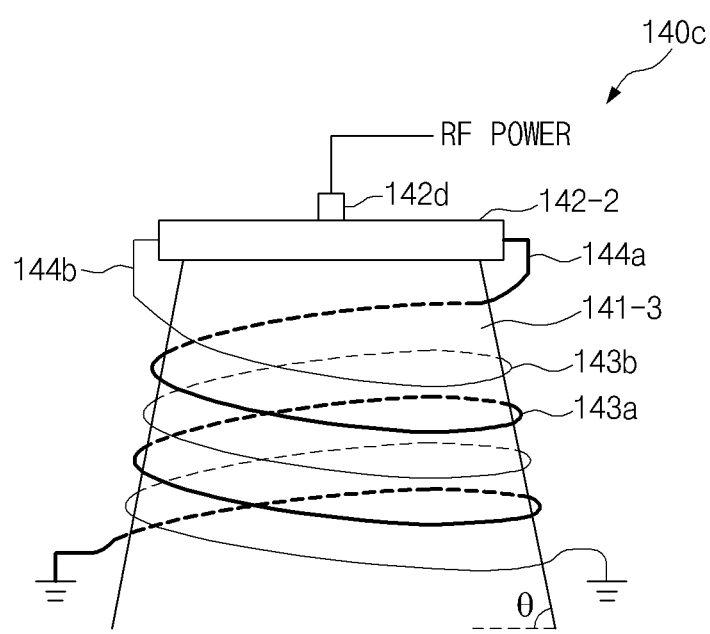
FIG. 5 is a side diagram of a plasma source part in an example in which a dielectric part of FIG. 2 is of a cone shape.
Figure 6:
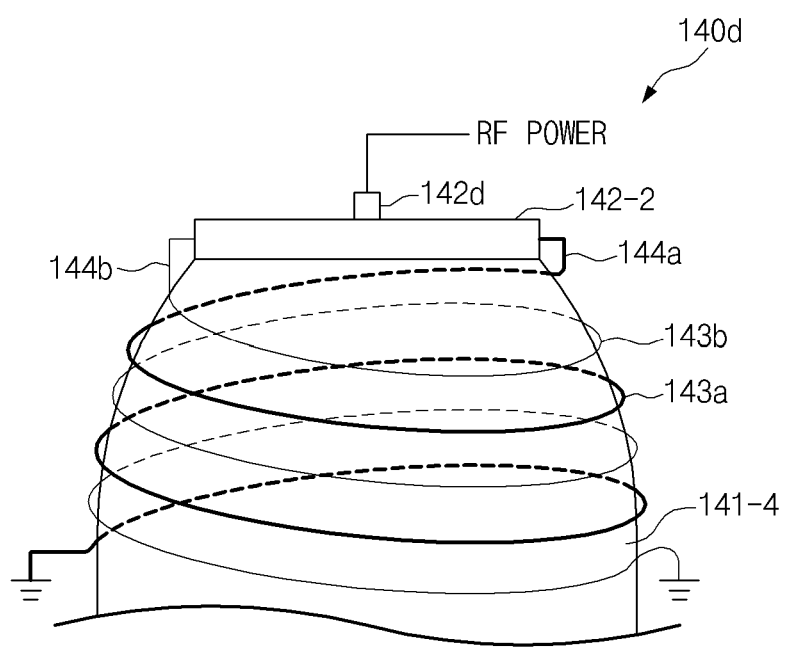
FIG. 6 is a side diagram of a plasma source part in an example in which a dielectric part of FIG. 2 is of a dome shape.

FIG. 2 is a schematic cross section of a plasma generating apparatus according to a first example embodiment. For the simplicity of drawings, FIG. 1 illustrates only key parts related to embodiments.

The plasma generating apparatus 101 includes a vacuum chamber 110, an adapter 120, an ElectroStatic Chuck (ESC) (or a susceptor) 130, a plasma source part 140, a Radio Frequency (RF) power supply part 150, a gas shower head 160, and an electrostatic chuck elevator 170. The vacuum chamber 110 is opened at its top. The adapter 120 covers the top of the vacuum chamber 110 to seal the opened top of the vacuum chamber 110, and is grounded. The adapter 120 is positioned below the dielectric part 141 and may constitute a part of the vacuum chamber 110 body. In other words, a part of the body of the vacuum chamber 110 may include the adapter 120. The adapter 120 has a through-hole in its partial region. The through-hole of the adapter 120 can be provided in a shape corresponding to an upper electrode 142.

The electrostatic chuck 130 is installed within the vacuum chamber 110, and mounts a target substrate 50 on its top surface. A bias RF power supply part (not shown) supplies a bias RF power to the electrostatic chuck 130.

The plasma source part 140 generates plasma within the vacuum chamber 110. The plasma source part 140 includes the dielectric part 141, the upper electrode 142, inductive coils 143a and 143b, and conductive connectors 144a and 144b.

The dielectric part 141 may be installed to protrude upward along a circumference of the through-hole of the adapter 120. The dielectric part 141 may be formed of dielectric materials such as ceramic dielectric, quartz, etc. The dielectric part 141 may be of any one of a square pipe shape, a cylinder shape, a cone shape, and a dome shape. FIGS. 3 to 6 illustrate plasma source parts 140a to 140d, including a square pipe shape dielectric part 141-1, a cylinder shape dielectric part 141-2, a cone shape dielectric part 141-3, and a dome shape dielectric part 141-4, respectively. The cone shape dielectric part 141-3 has upper and lower parts whose diameters are different from each other, and has a side wall slanting by a predetermined angle ($\theta$) about a bottom surface.

Referring again to FIG. 2, the upper electrode 142 may be coupled to seal an opened top of the dielectric part 141. The upper electrode 142 may be realized by a plate shape antenna of a polygon such as a circle, a triangle, or a square. A shape of the upper electrode 142 may vary, depending on a shape of the dielectric part 141. For example, in an example in which the dielectric part 141 is of a square pipe shape, an upper electrode 142-1 (FIG. 3) may be formed in a square shape. Also, in an example in which the dielectric part 141 is of any one of a cylinder shape, a cone shape, and a dome shape, upper electrodes 142-2 (FIGS. 4 to 6) may be formed in a circle shape. The upper electrode 142 includes a coolant inlet 142a and a gas inlet 142c. A coolant passage 142b may be formed inside the upper electrode 142.

A coolant injected through the coolant inlet 142a of the upper electrode 142 flows to the coolant passage 142b, and a reaction gas is injected into the vacuum chamber 110 through the gas inlet 142c.

Figure 7:
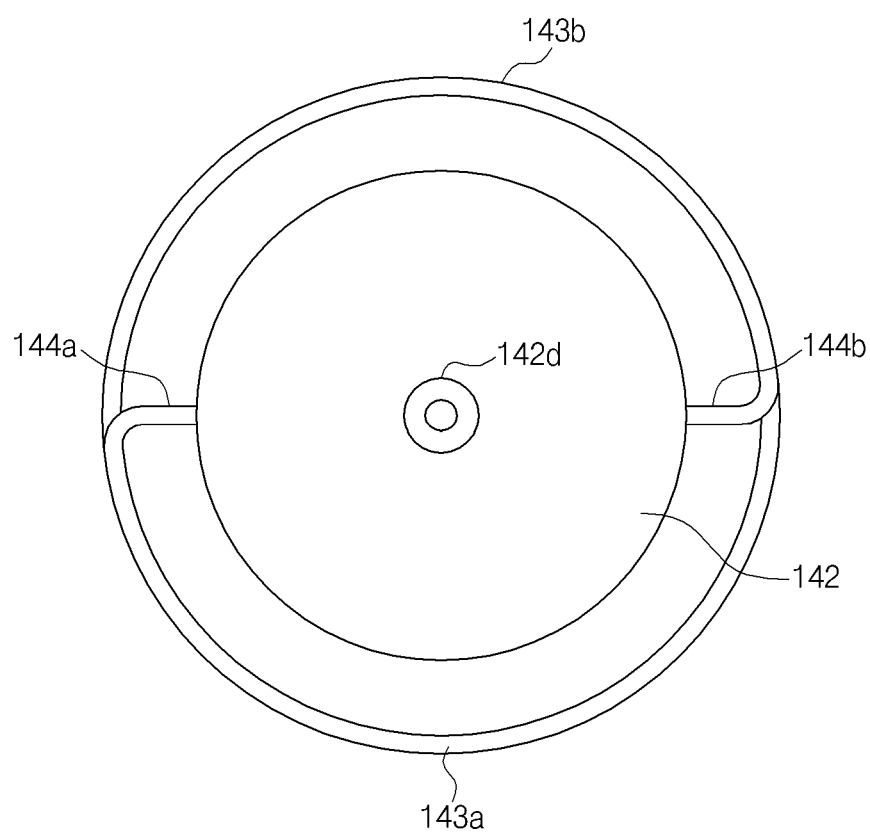
FIG. 7 is a plane diagram of an upper electrode and inductive coils in an example in which a dielectric part of FIG. 2 is a cylinder shape.
Figure 8:
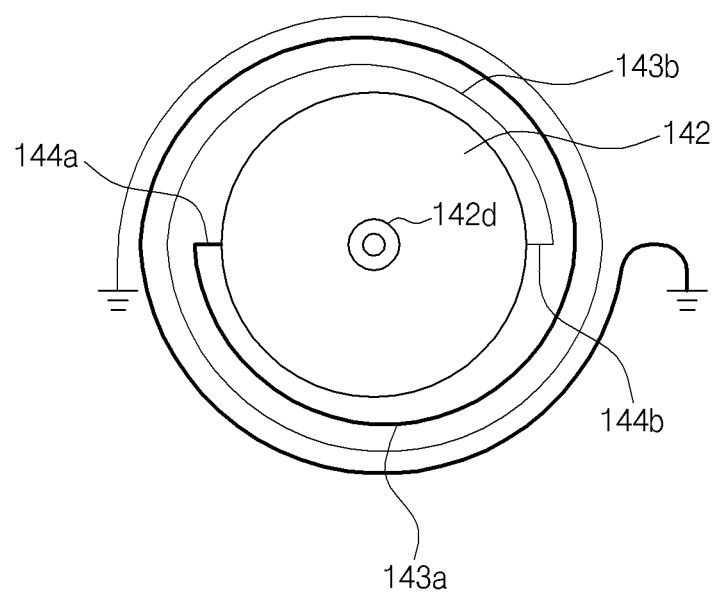
FIG. 8 is a plane diagram of an upper electrode and inductive coils in an example in which a dielectric part of FIG. 2 is of a cone shape or dome shape.

The inductive coils 143a and 143b spirally extend along an outer circumference surface of the dielectric part 141. FIG. 7 is a plane diagram illustrating the upper electrode 142 and the inductive coils 143a and 143b in an example in which the dielectric part 141 is of a cylinder shape. Also, FIG. 8 is a plane diagram illustrating the upper electrode 142 and the inductive coils 143a and 143b in an example in which the dielectric part 141 is of a cone shape or dome shape.

The one ends of the inductive coils 143a and 143b connect to conductive connectors 144a and 144b, respectively, and the other ends of the inductive coils 143a and 143b connect to the adaptor 120. In result, the inductive coils 143a and 143b are fixed by the adaptor 120.

The inductive coils 143a and 143b and the conductive coils 144a and 144b can be formed as hollow shape conductive pipes, respectively.

A coolant injected into the upper electrode 142 through the coolant inlet 142a flows along a path composed of the inside (e.g., the coolant passage 142b) of the upper electrode, the insides of the conductive pipes (e.g., the conductive connectors 144a and 144b and the inductive coils 143a and 143b), and a coolant outlet 121 formed in the adapter 120. In result, a heat generated by a plasma source is cooled.

The conductive connectors 144a and 144b electrically connect the one ends of the inductive coils 143a and 143b with the upper electrode 142, respectively. FIG. 2 illustrates the two inductive coils and the two conductive connectors, but the inductive coils and the conductive connectors included in the plasma source part 140 can more increase in number according to need.

The RF power supply part 150 connects to an RF terminal 142d of the upper electrode 142 and supplies an RF power to the upper electrode 142. When the RF power is applied to the upper electrode 142, the RF power is also supplied to the inductive coils 143a and 143b connecting to the upper electrode 142 through the conductive connectors 144a and 144b. In result, capacitively coupled and inductively coupled plasma is generated within the vacuum chamber 110.

The RF power supply part 150 includes an RF source 151 and a source matcher 152. The RF source 151 generates an RF power. The source matcher 152 connects between an output of the RF source 151 and the RF terminal 142d of the upper electrode 142, for the sake of impedance matching.

The gas shower head 160 is installed below the upper electrode 142. The gas shower head 160 includes a gas distribution plate 161 and a gas diffusion plate 162. The gas distribution plate 161 has a plurality of gas jet ports 161a. The gas diffusion plate 162 is installed between the upper electrode 142 and the gas distribution plate 161, and uniformly diffuses a gas introduced through the gas inlet 142c. Although not shown in detail in FIG. 2, a protrusion for fixing the gas diffusion plate 162 can be formed on an inner wall of the gas distribution plate 161. This protrusion can maintain an interval set between a bottom surface of the gas diffusion plate 162 and a top surface of the gas distribution plate 161.

The electrostatic chuck elevator 170 is installed below the electrostatic chuck 130, and elevates up or down the electrostatic chuck 130. In result, a gap between the upper electrode 142 and the electrostatic chuck 130 is controlled and a capacitance is controlled. The electrostatic chuck elevator 170 can be realized by a bellows tube, for example. The cover 180 is attached to a top of the adaptor 120 by means of a seal 60 with surrounding the plasma source part 140.

As described above, the plasma generating apparatus 101 includes the upper electrode 140 and the inductive coils 143a and 143b to generate plasma within the vacuum chamber 110. Therefore, plasma (P) can be distributed at a uniform density at a center and edge within the vacuum chamber 110. Accordingly, a process failure resulting from the non-uniformity of a density of plasma (P) can be suppressed.

Figure 9:
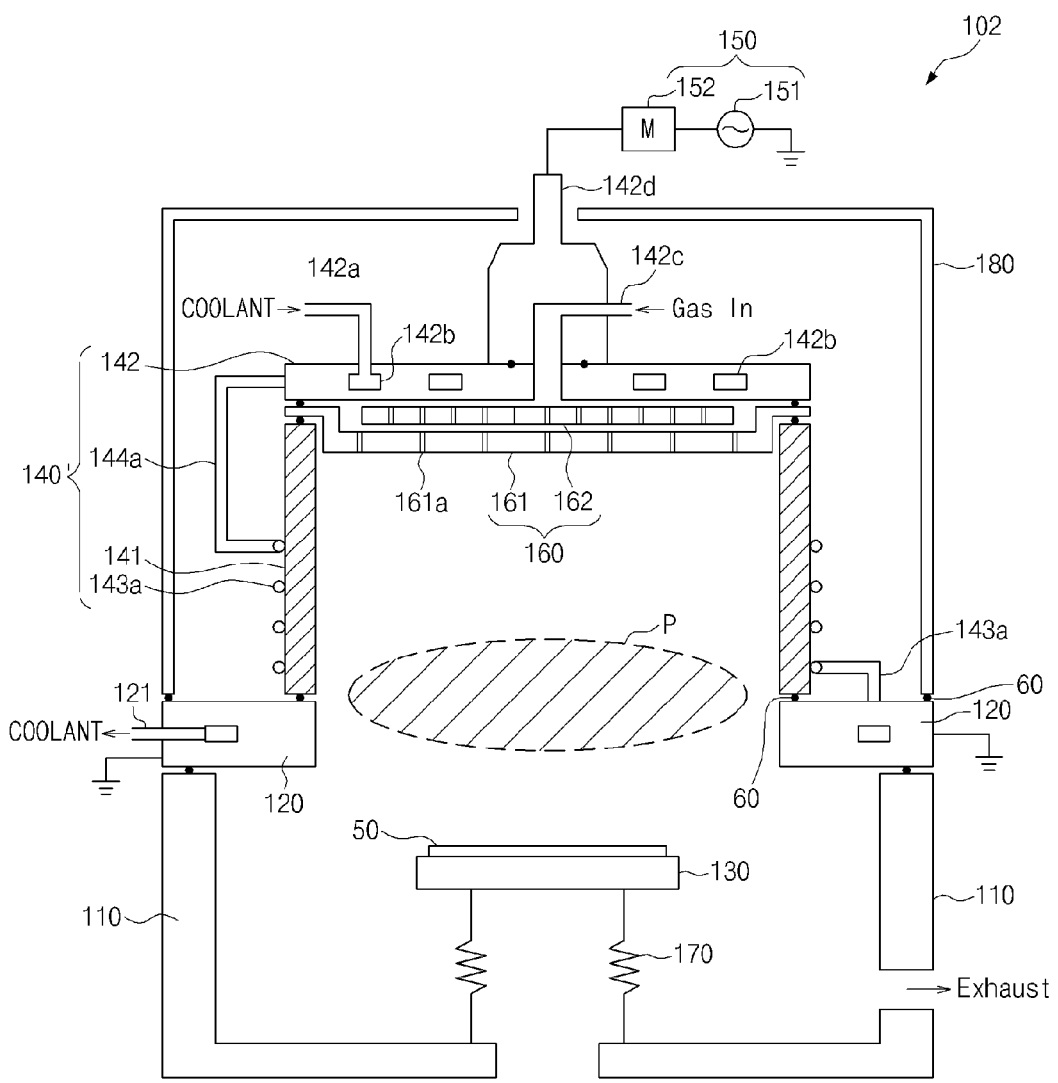
FIG. 9 is a schematic cross section of a plasma generating apparatus according to a second example embodiment.

FIG. 9 is a schematic cross section of a plasma generating apparatus according to a second example embodiment.

A construction of the plasma generating apparatus 102 is the same as that of the plasma generating apparatus 101 described with reference to FIG. 2 excepting one difference. Also, the plasma generating apparatus 102 shows an operation performance and effect similar to those of the plasma generating apparatus 101.

To avoid the redundancy of description, in this example embodiment, a description is made centering on a difference between the plasma generating apparatuses 102 and 101.

Figure 10:
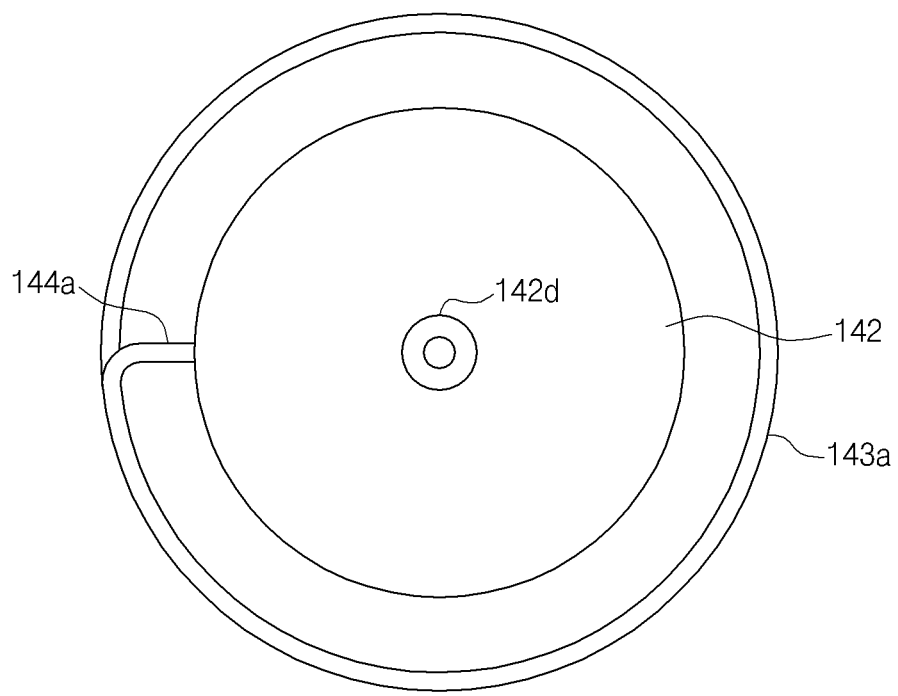
FIG. 10 is a plane diagram of an upper electrode and an inductive coil illustrated in FIG. 9.

The difference between the plasma generating apparatuses 102 and 101 is that a plasma source part 140' of the plasma generating apparatus 102 includes one inductive coil 143a and one conductive connector 144a. As illustrated in FIG. 10, the inductive coil 143a electrically connects to an upper electrode 142 through the conductive connector 144a.

The inductive coil 143a and the conductive connector 144a can be formed as hollow shape conductive pipes, respectively. A coolant injected into the upper electrode 142 through a coolant inlet 142a flows along a path composed of the inside (e.g., a coolant passage 142b) of the upper electrode, the insides of the conductive pipes (e.g., the conductive connector 144a and the inductive coil 143a), and a coolant outlet 121 formed in an adaptor 120. In result, a heat generated by a plasma source is cooled.

Figure 11:
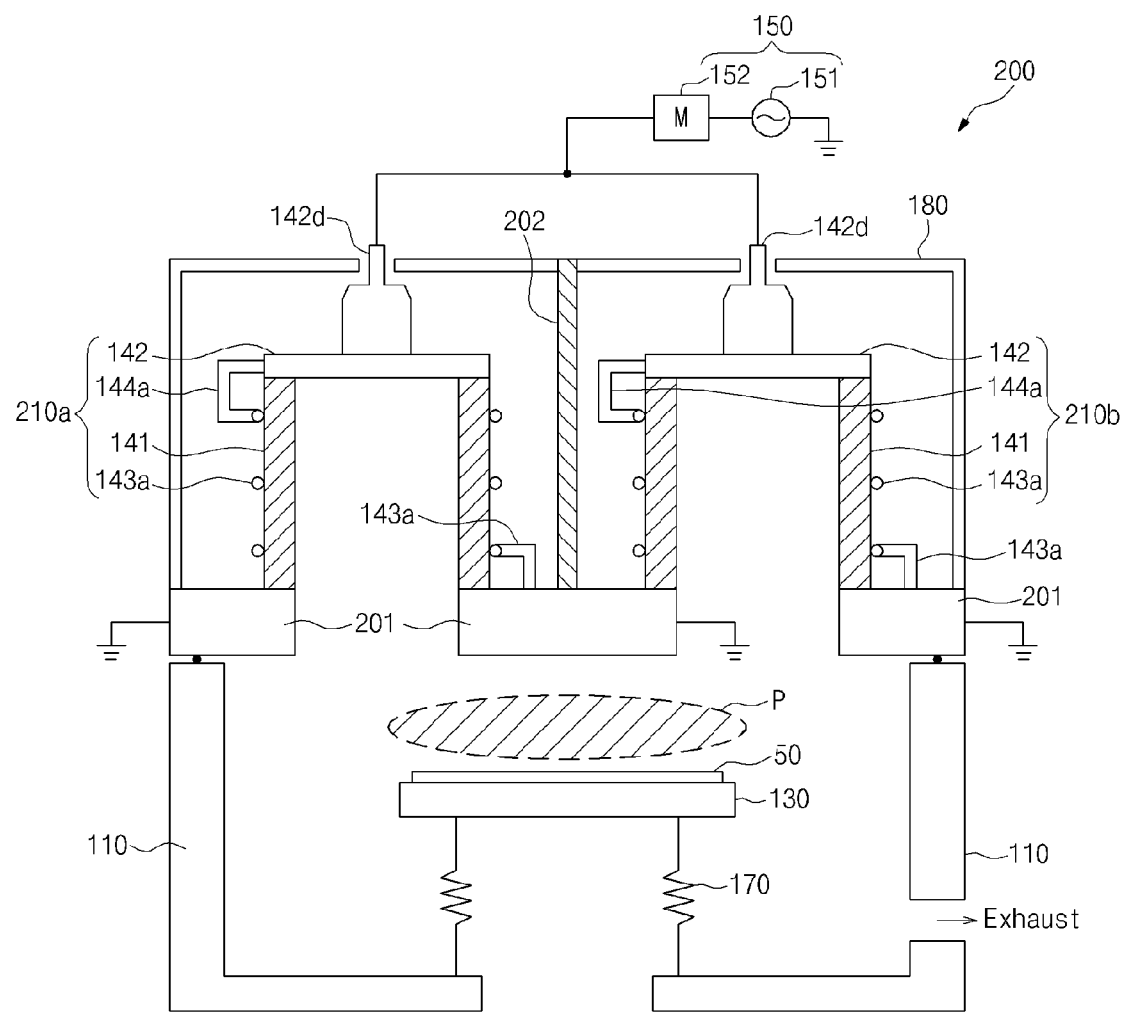
FIG. 11 is a schematic cross section of a plasma generating apparatus according to a third example embodiment.

FIG. 11 is a schematic cross section of a plasma generating apparatus according to a third example embodiment. For the simplicity of drawings, FIG. 11 omits an illustration of a coolant inlet 142a, a coolant passage 142b, a gas inlet 142c, a coolant outlet 121, and a gas shower head 160.

A construction of the plasma generating apparatus 200 is the same as that of the plasma generating apparatus 102 described with reference with FIG. 9 excepting one difference. Also, the plasma generating apparatus 200 shows an operation performance and effect similar to those of the plasma generating apparatus 102.

To avoid the redundancy of description, in this example embodiment, a description is made centering on a difference between the plasma generating apparatuses 200 and 102.

The difference between the plasma generating apparatuses 200 and 102 is that an adaptor 201 of the plasma generating apparatus 200 has a plurality of through-holes, and a plurality of plasma source parts 210a and 210b are installed on the plurality of through-holes. An interference prevention part 202 is installed between the plurality of plasma source parts 210a and 210b. The interference prevention part 202 can be formed of materials such as a conductive metal, etc. The interference prevention part 202 is grounded and prevents interference between the plurality of plasma source parts 210a and 210b.

The plasma generating apparatus 200 can diversely vary the distribution of an electric field formed within the vacuum chamber 110 by means of the plurality of plasma source parts 210a and 210b. Accordingly, the distribution of plasma can be uniformly or variously controlled within the vacuum chamber 110. Referring to FIGS. 27A to 27D, it can be appreciated that a density (D) of plasma is varied in accordance with a characteristic of a substrate 50 to be processed.

Figure 12:
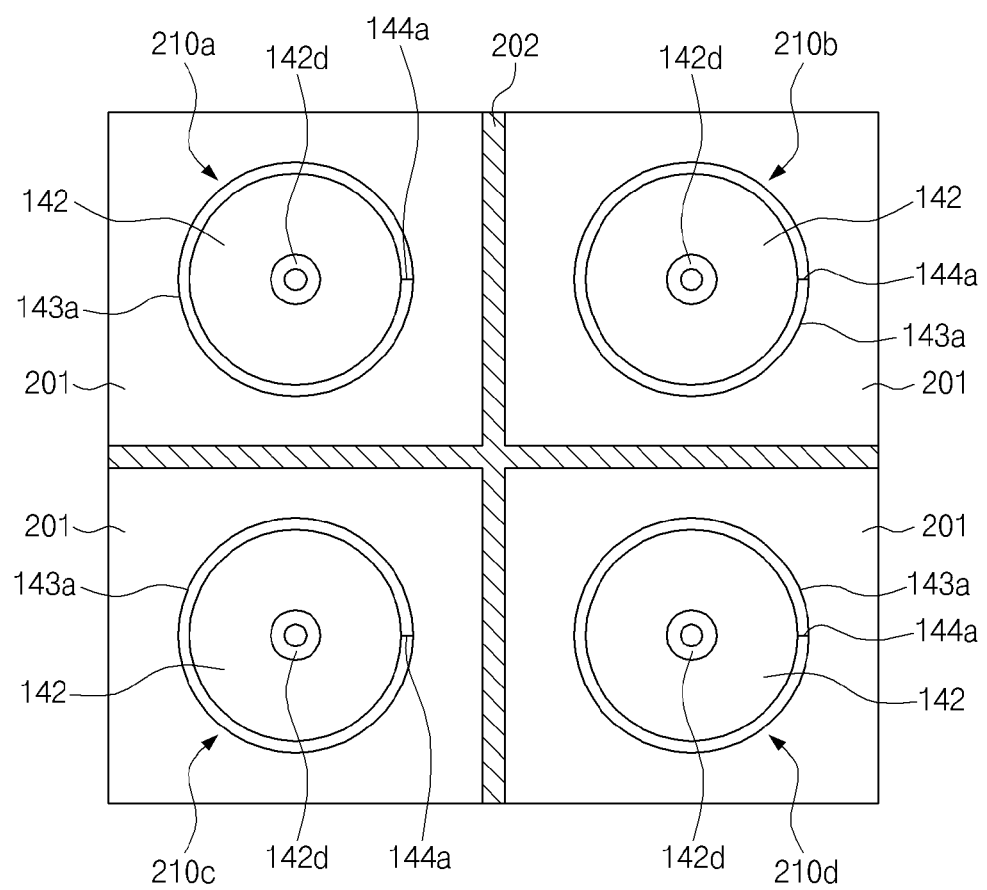
FIG. 12 is a plane diagram of a plasma generating apparatus in which a top of a cover 180 is not shown, in an example in which an upper electrode of FIG. 11 is of a circle shape.

FIG. 12 is a plane diagram of the plasma generating apparatus in which a top of a cover 180 is not shown, in an example in which the upper electrode of FIG. 11 is of a circle shape. The plasma generating apparatus 200 includes four plasma source parts 210a to 210d. An interference prevention part 202 is installed between the plasma source parts 210a to 210d.

Figure 13:
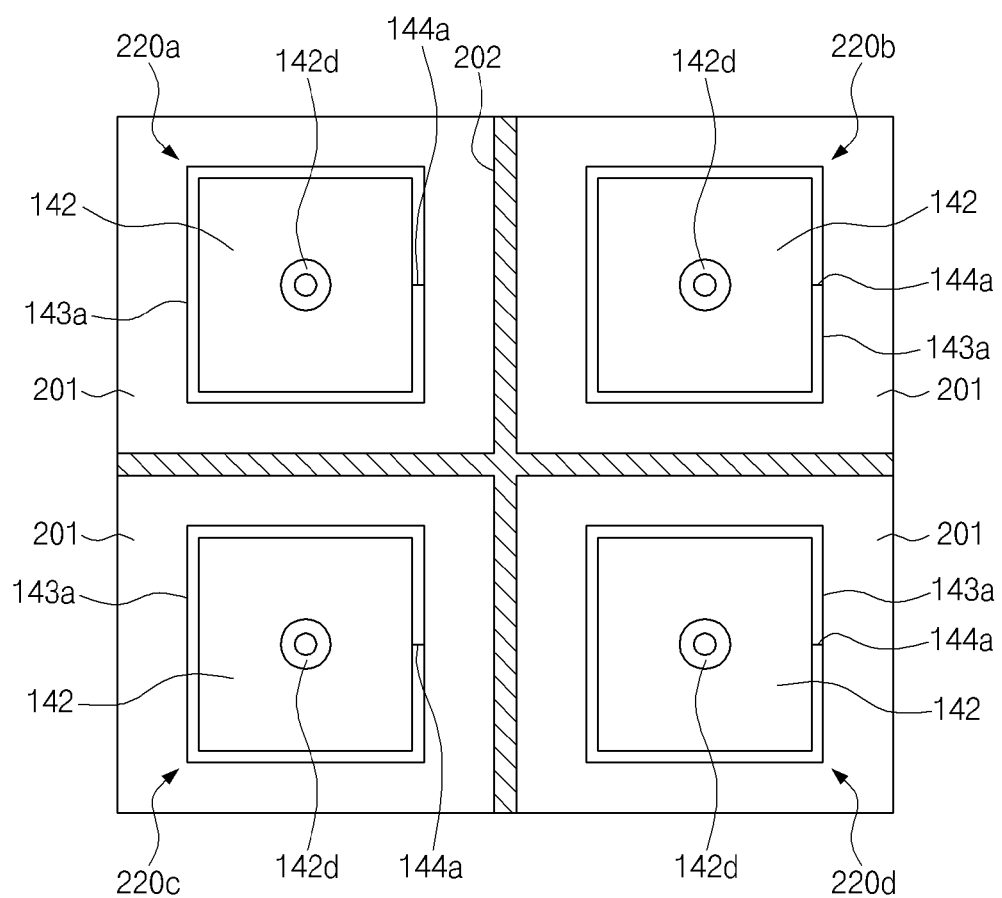
FIG. 13 is a plane diagram of a plasma generating apparatus in which a top of a cover 180 is not shown, in an example in which an upper electrode of FIG. 11 is of a square shape.

FIG. 13 is a plane diagram of the plasma generating apparatus in which a top of a cover 180 is not shown, in an example in which the upper electrode of FIG. 11 is of a square shape. The plasma generating apparatus 200' includes four plasma source parts 220a to 220d. An interference prevention part 202 is installed between the plasma source parts 220a to 220d.

In FIGS. 11 to 13, the plasma generating apparatus 200 or 200' including the four plasma source parts 210a to 210d or 220a to 220d is illustrated as one example, but this construction is not intended to limit the scope of embodiments. That is, the plasma source parts included in the plasma generating apparatus 200 can increase or decrease in number according to need. Also, an array of the plasma source parts can change variously. On the other hand, a dielectric part 141 applied to the plasma generating apparatus 200 can be of any one of a square pipe shape, a cylinder shape, a cone shape, and a dome shape.

Figure 14:
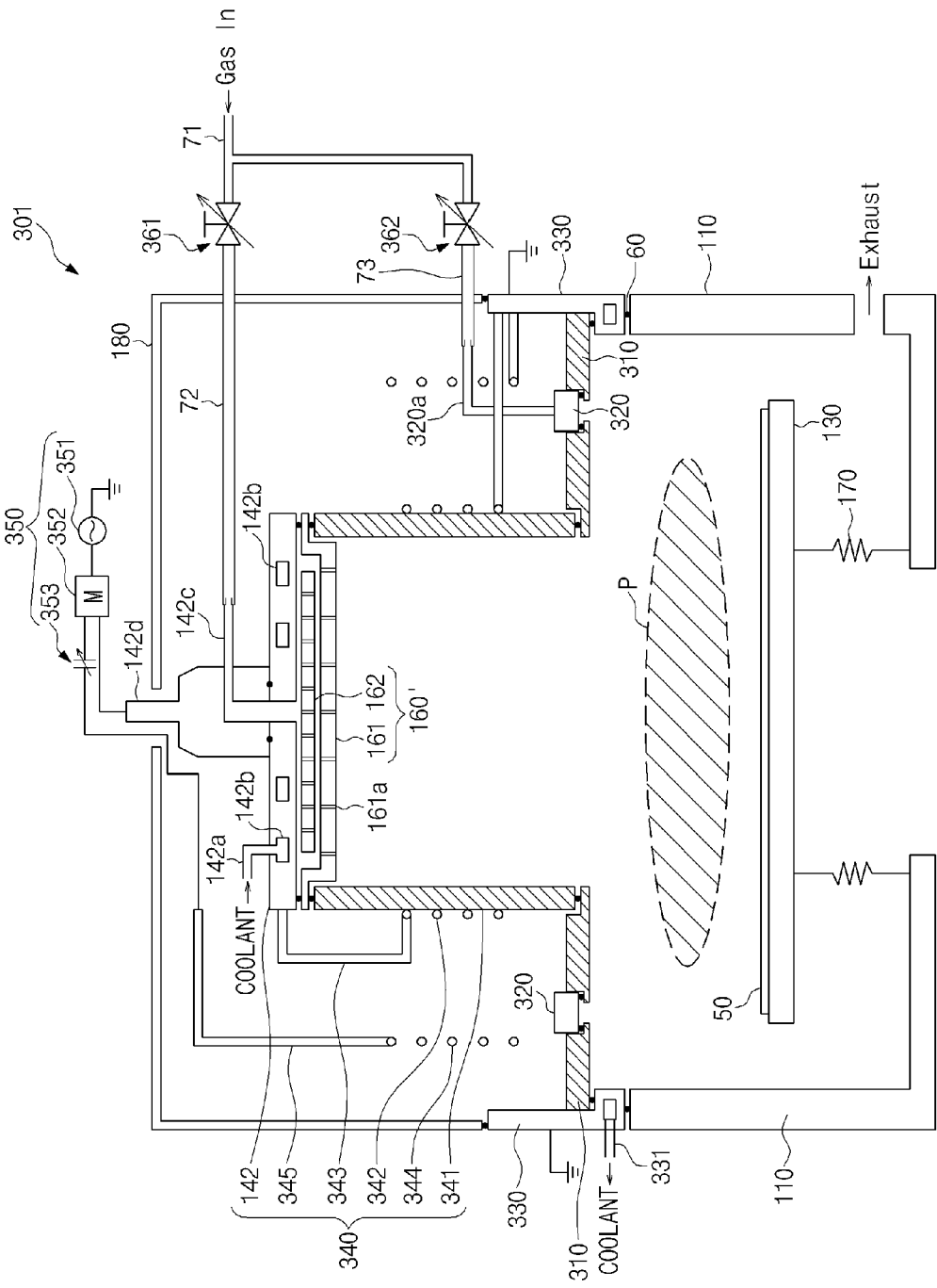
FIG. 14 is a schematic cross section of a plasma generating apparatus according to a fourth example embodiment.

FIG. 14 is a schematic cross section of a plasma generating apparatus according to a fourth example embodiment. The plasma generating apparatus 301 includes a vacuum chamber 110, an electrostatic chuck (or a susceptor) 130, a center gas shower head 160', an electrostatic chuck elevator 170, a dielectric part 310, an edge gas shower head 320, an adaptor 330, a plasma source part 340, an RF power supply part 350, and gas controllers 361 and 362.

A description of the vacuum chamber 110, the electrostatic chuck 130, and the electrostatic chuck elevator 170 is substantially the same as the above description made with reference to FIG. 2 and thus, is omitted to avoid the redundancy of description.

The dielectric part 310 covers a top of the vacuum chamber 110 to seal the top of the vacuum chamber 110. The dielectric part 310 has a through-hole in its partial region. The through-hole of the dielectric part 310 can be formed in a shape corresponding to an upper electrode 142. The dielectric part 310 can be formed of dielectric materials such as ceramic dielectric, quartz, etc.

The plasma source part 340 generates plasma within the vacuum chamber 110. The plasma source part 340 includes a dielectric part 341, the upper electrode 142, a center inductive coil 342, a center conductive connector 343, an edge inductive coil 344, and an edge conductive connector 345.

The dielectric part 341 is installed to protrude upward along a circumference of the through-hole of the dielectric part 310. The dielectric part 341 can be formed of dielectric materials such as ceramic dielectric, quartz, etc. Similar to the dielectric parts 141-1, 141-2, 141-3, and 141-4 of FIGS. 3 to 6, the dielectric part 341 can be of any one of a square pipe shape, a cylinder shape, a cone shape, and a dome shape.

A description of the upper electrode 142 is substantially the same as the above description made with reference to FIG. 2 and thus, is omitted to avoid the redundancy of description.

The center inductive coil 342 spirally extends along an outer circumference surface of the dielectric part 341. The edge inductive coil 344 spirally extends along a circumference of the center inductive coil 342 at a set distance from the center inductive coil 342.

One end of the center inductive coil 342 connects to the center conductive connector 343, and one end of the edge inductive coil 344 connects to the edge conductive connector 345. The center conductive connector 343 electrically connects the upper electrode 142 with the one end of the center inductive coil 342. The other end of the center inductive coil 342 and the other end of the edge inductive coil 344 connect to the adaptor 330. In result, the center inductive coil 342 and the edge inductive coil 344 are fixed by the adaptor 330.

The center inductive coil 342 and the center conductive connector 343 can be formed as hollow shape conductive pipes, respectively. A coolant injected into the upper electrode 142 through a coolant inlet 142a flows along a path composed of the inside (e.g., a coolant passage 142b) of the upper electrode, the insides of the conductive pipes (e.g., the center conductive connector 343 and the center inductive coil 342), and a coolant outlet 331 formed in the adapter 330. In result, a heat generated by a plasma source is cooled.

Figure 15:
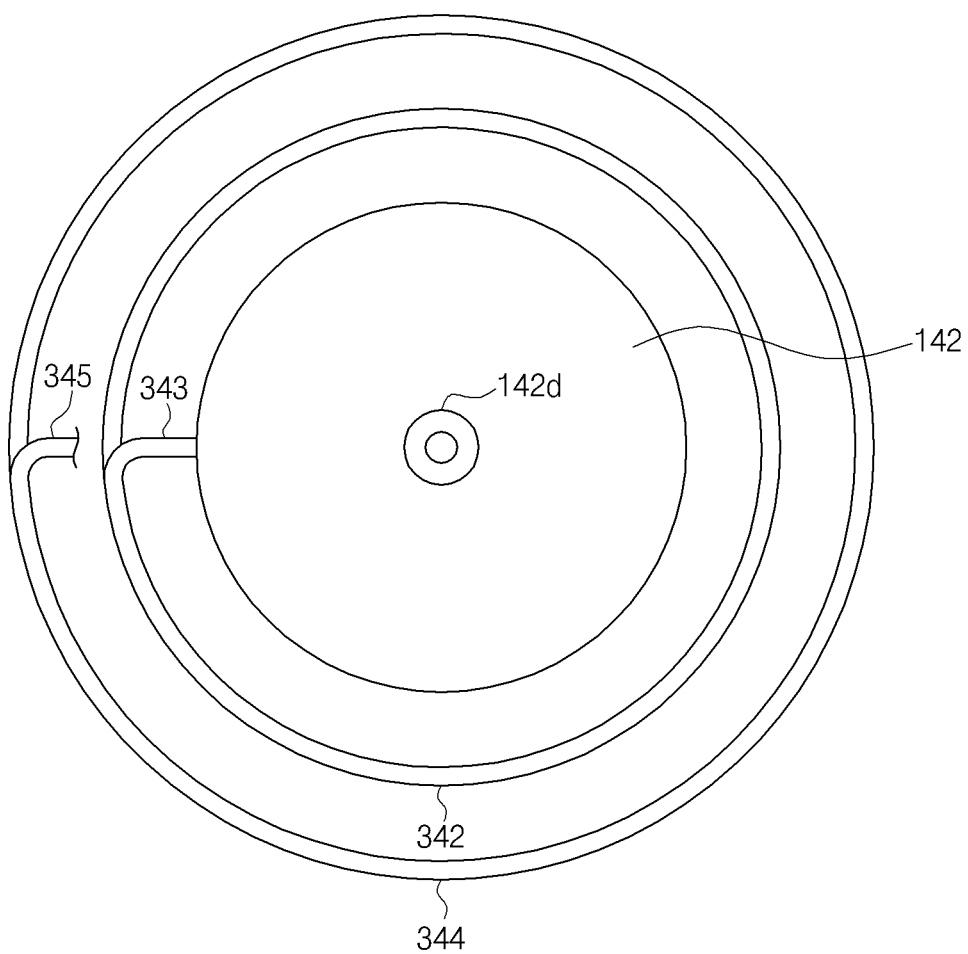
FIG. 15 is a plane diagram of an upper electrode and inductive coils illustrated in FIG. 14.
Figure 16:
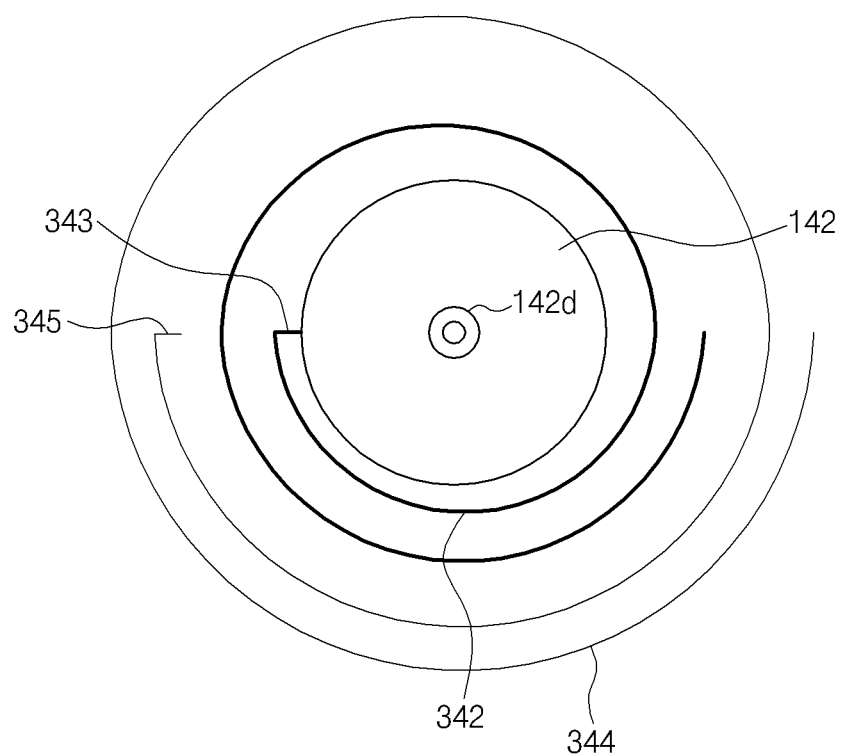
FIG. 16 is a plane diagram of an upper electrode and inductive coils in an example in which a dielectric part of FIG. 14 is of a cone shape or dome shape.

FIG. 15 is a plane diagram illustrating the upper electrode 142, the center inductive coil 342, and the edge inductive coil 344 in an example in which the dielectric part 341 is of a cylinder shape. Also, FIG. 16 is a plane diagram illustrating the upper electrode 142, the center inductive coil 342, and the edge inductive coil 344 in an example in which the dielectric part 341 is of a cone shape or dome shape. For the simplicity of drawings, FIGS. 15 and 16 omit an illustration of a part of the edge conductive connector 345.

Referring again to FIG. 14, the RF power supply part 350 includes an RF source 351, a source matcher 352, and a variable capacitor 353. The RF source 351 generates an RF power. The source matcher 352 connects to an output of the RF source 351 for the sake of impedance matching.

The variable capacitor 353 connects between a first output of the source matcher 352 and the edge conductive connector 345, and controls an amount of an electric current flowing in the edge inductive coil 344. A second output of the source matcher 352 connects to an RF terminal 142d of the upper electrode 142.

The RF power supply part 350 supplies an RF power to the upper electrode 142 and the edge inductive coil 344, respectively. When the RF power is applied to the upper electrode 142, the RF power is also supplied to the center inductive coil 342 connecting to the upper electrode 142 through the center conductive connector 343. In result, capacitively coupled and inductively coupled plasma is generated within the vacuum chamber 110.

FIG. 14 illustrates that the variable capacitor 353 connects between the first output of the source matcher 352 and the edge conductive connector 345, as one example.

However, the variable capacitor 353 may connect between the second output of the source matcher 352 and the RF terminal 142d of the upper electrode 142.

The reason why the RF power supply part 350 includes the variable capacitor 353 is that there is a big difference of a resistance value between the center inductive coil 342 and the edge inductive coil 344. That is, the resistance value of the center inductive coil 342 is less than the resistance value of the edge inductive coil 344. Accordingly, there is a need to keep an amount of an electric current flowing in the edge inductive coil 344 greater than an amount of an electric current flowing in the center inductive coil 342.

The center gas shower head 160' is installed below the upper electrode 142. A description of the center gas shower head 160' is substantially the same as the above description made with reference to FIG. 2 and thus, is omitted to avoid the redundancy of description.

Figure 17:
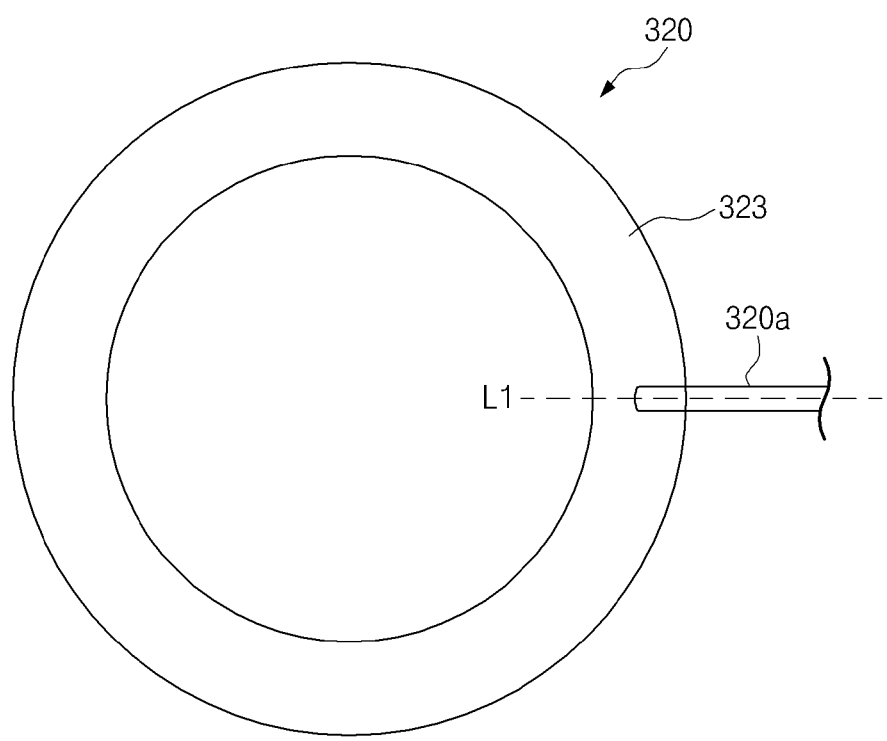
FIG. 17 is a plane diagram of an edge gas shower head illustrated in FIG. 14.

The dielectric part 310 has an opening in its partial region between the center inductive coil 342 and the edge inductive coil 344, along a circumference of the dielectric part 341. The edge gas shower head 320 is installed to cover the opening of the dielectric part 310. The edge gas shower head 320 can be formed in a ring shape corresponding to the upper electrode 142. For example, in an example in which the upper electrode 142 is of a circle shape, as illustrated in FIG. 17, the edge gas shower head 320 can be formed in a circular ring shape. Also, in an example in which the upper electrode 142 is of a square shape, the edge gas shower head 320 can be formed in a square ring shape.

Figure 18:
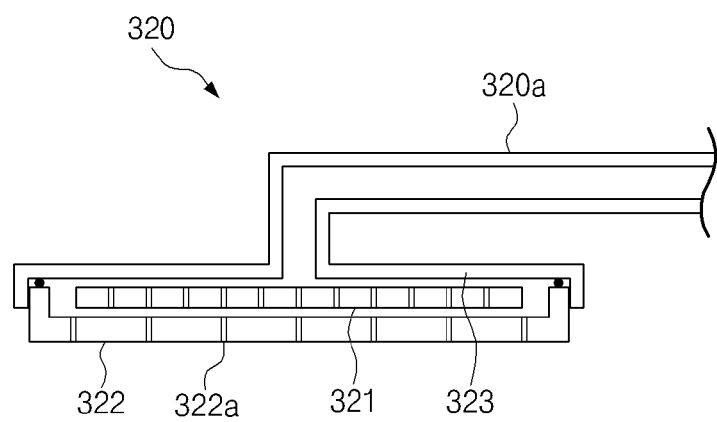
FIG. 18 is a cross section of an edge gas shower head taken along dotted line "L1" of FIG. 17.

Referring to FIG. 18, the edge gas shower head 320 includes a gas diffusion plate 321, a gas distribution plate 322, and a cover 323. The gas diffusion plate 321 uniformly diffuses a gas introduced through a gas inlet 320a. The gas distribution plate 322 is formed in a "U" shape to house the gas diffusion plate 321. The gas distribution plate 322 jets a gas diffused by the gas diffusion plate 321, into the vacuum chamber 110 through a plurality of gas jet ports 322a. The cover 323 has the gas inlet 320a, and covers a top of the gas distribution plate 322.

Referring again to FIG. 14, a gas controller 361 connects between pipes 71 and 72, and a gas controller 362 is connected between pipes 71 and 73. The pipe 72 connects to the gas inlet 142c of the upper electrode 142, and the pipe 73 connects to the gas inlet 320a of the edge gas shower head 320. The gas controller 361 controls an amount of gas introduced into the edge gas shower head 160'. The gas controller 362 controls an amount of gas introduced into the edge gas shower head 320. By means of the gas controllers 361 and 362, the amount of gas introduced into the center gas shower head 160' and the amount of gas introduced into the edge gas shower head 320 can be independently controlled, respectively.

The plasma generating apparatus 301 can variously vary the distribution of an electric field formed within the vacuum chamber 110 by the upper electrode 142, the center inductive coil 342, and the edge inductive coil 344. Accordingly, the distribution of plasma can be uniformly or variously controlled within the vacuum chamber 110. That is, as illustrated in FIGS. 27A to 27D, the plasma generating apparatus 301 can variously vary a density (D) of plasma in accordance with a characteristic of a substrate 50 to be processed. Also, the plasma generating apparatus 301 can increase a plasma density by means of a dual coil structure of the center inductive coil 342 and the edge inductive coil 344, and can be of use in processing a large size substrate 50.

Figure 19:
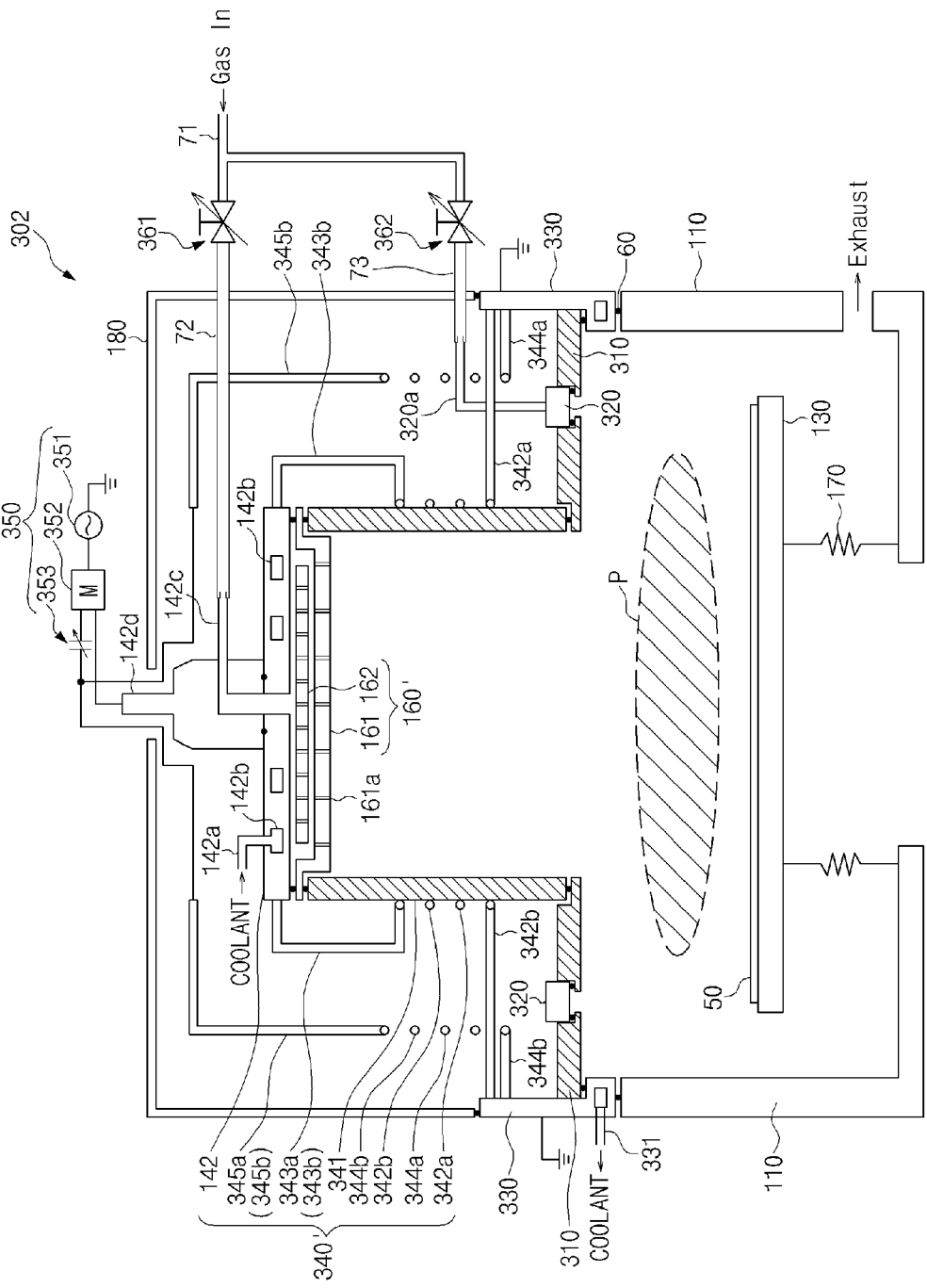
FIG. 19 is a schematic cross section of a plasma generating apparatus according to a fifth example embodiment.

FIG. 19 is a schematic cross section of a plasma generating apparatus according to a fifth example embodiment. A construction of the plasma generating apparatus 302 is the same as that of the plasma generating apparatus 301 described above with reference to FIG. 14 excepting one difference. Also, the plasma generating apparatus 302 shows an operation performance and effect similar to those of the plasma generating apparatus 301.

To avoid the redundancy of description, in this example embodiment, a description is made centering on a difference between the plasma generating apparatuses 302 and 301.

The difference between the plasma generating apparatuses 302 and 301 is that a plasma source part 340' of the plasma generating apparatus 302 includes two center inductive coils 342a and 342b, two center conductive connectors 343a and 343b, two edge inductive coils 344a and 344b, and two edge conductive connectors 345a and 345b.

Figure 20:
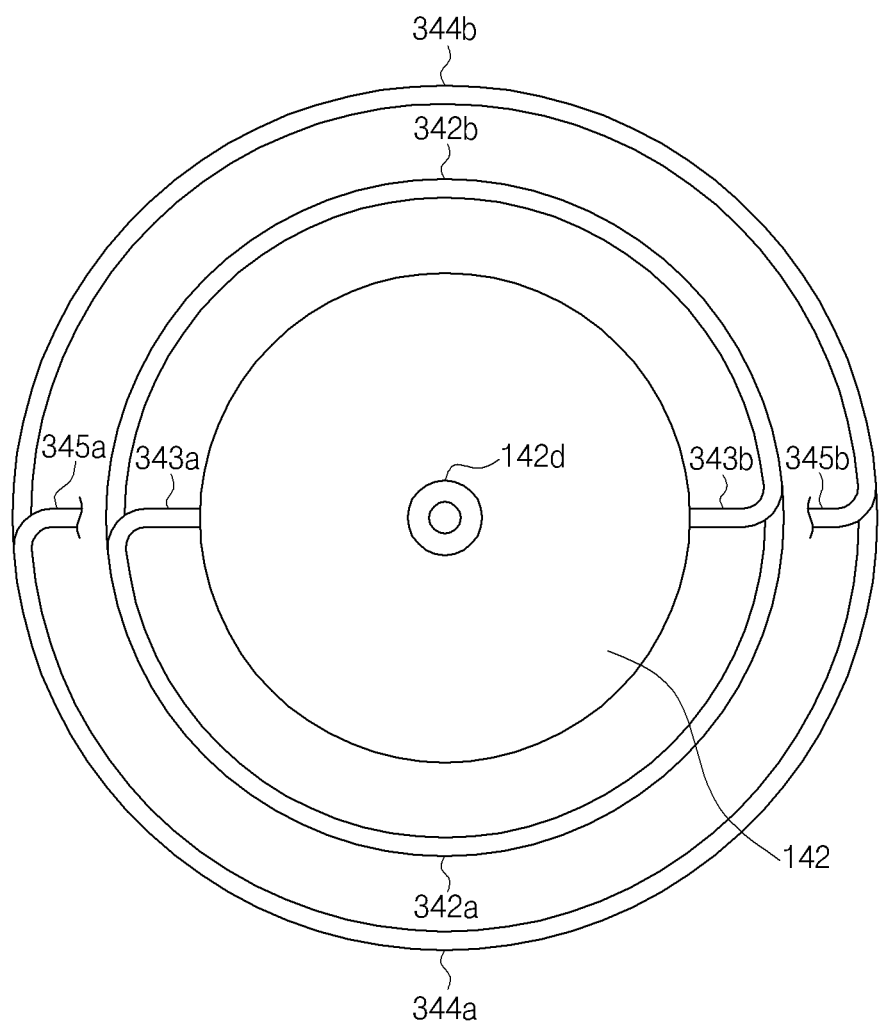
FIG. 20 is a plane diagram of an upper electrode and inductive coils illustrated in FIG. 19.
Figure 21:
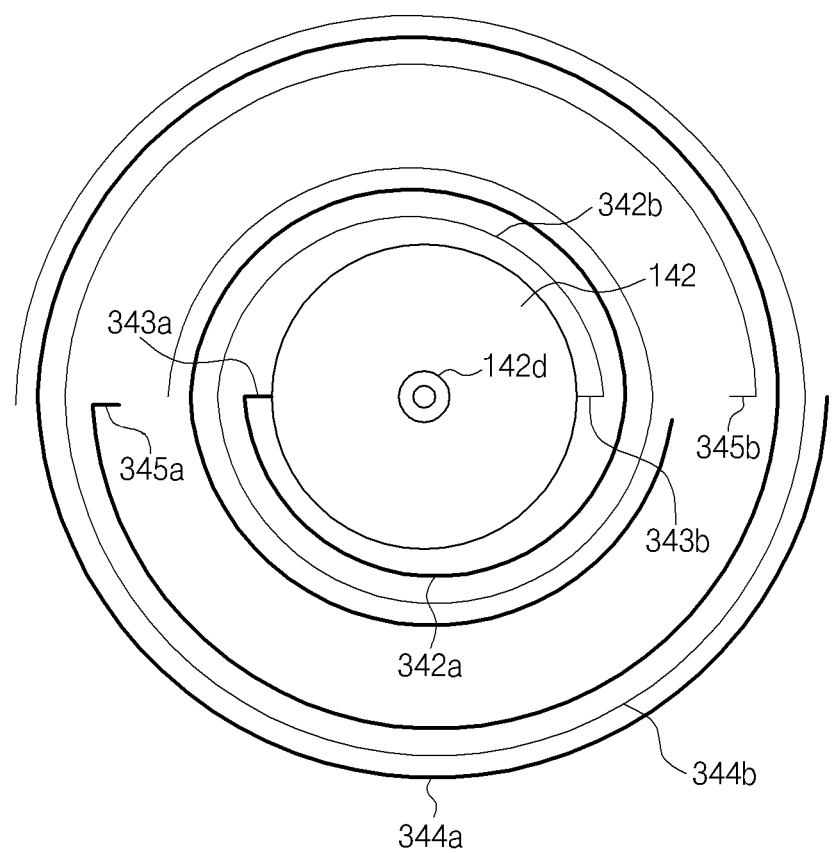
FIG. 21 is a plane diagram of an upper electrode and inductive coils in an example in which a dielectric part of FIG. 19 is of a cone shape or dome shape.

FIG. 20 is a plane diagram illustrating an upper electrode 142, the center inductive coils 342a and 342b, and the edge inductive coils 344a and 344b in an example in which a dielectric part 341 is of a cylinder shape. Also, FIG. 21 is a plane diagram illustrating the upper electrode 142, the center inductive coils 342a and 342b, and the edge inductive coils 344a and 344b in an example in which the dielectric part 341 is of a cone shape or dome shape. For the simplicity of drawings, FIGS. 20 and 21 omit an illustration of a part of the edge conductive connector 345a.

As illustrated in FIG. 20, the center conductive connectors 343a and 343b electrically connect the center inductive coils 342a and 342b to the upper electrode 142. The edge conductive connectors 345a and 345b connect to the one ends of the edge inductive coils 344a and 344b, respectively.

The other ends of the center inductive coils 342a and 342b and the other ends of the edge inductive coils 344a and 344b connect to the adaptor 330. In result, the center inductive coils 342a and 342b and the edge inductive coils 344a and 344b are fixed by the adaptor 330.

The center inductive coils 342a and 342b and the center conductive connectors 343a and 343b can be formed as hollow shape conductive pipes, respectively. A coolant injected into the upper electrode 142 through a coolant inlet 142a flows along a path composed of the inside (e.g., a coolant passage 142b) of the upper electrode, the insides of the conductive pipes (e.g., the center inductive coils 342a and 342b and the center conductive connectors 343a and 343b), and a coolant outlet 331 formed in the adaptor 330. In result, a heat generated by a plasma source is cooled.

FIG. 19 illustrates that the plasma source part 340' includes two per each of the center inductive coil, the center conductive connector, the edge inductive coil, and the edge conductive connector, as one example. However, the center inductive coils, the center conductive connectors, the edge inductive coils, and the edge conductive connectors included in the plasma source part 340' can more increase in number according to need.

Figure 22:
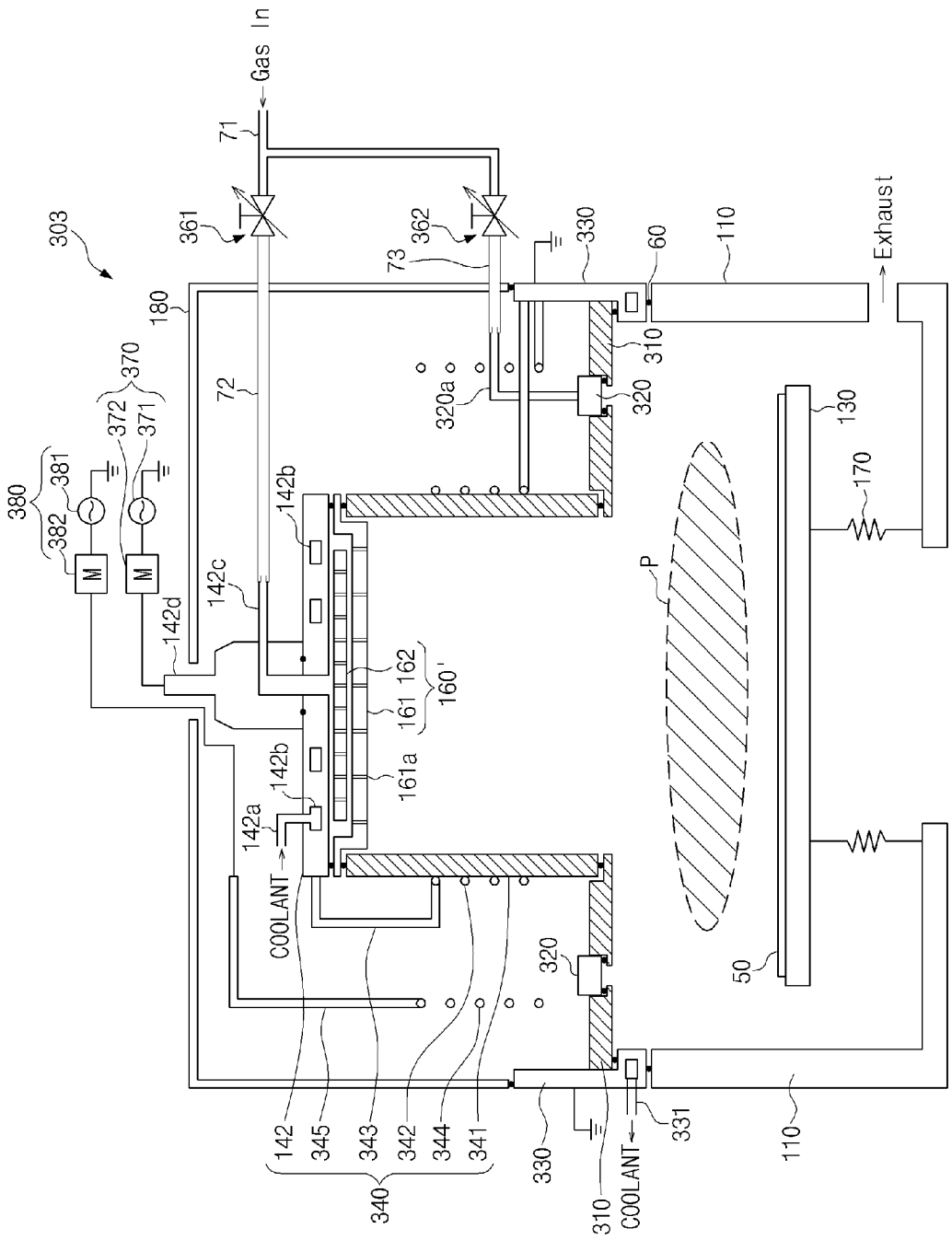
FIG. 22 is a schematic cross section of a plasma generating apparatus according to a sixth example embodiment.

FIG. 22 is a schematic cross section of a plasma generating apparatus according to a sixth example embodiment. A construction of the plasma generating apparatus 303 is the same as that of the plasma generating apparatus 301 described above with reference to FIG. 14 excepting one difference. Also, the plasma generating apparatus 303 shows an operation performance and effect similar to those of the plasma generating apparatus 301.

To avoid the redundancy of description, in this example embodiment, a description is made centering on a difference between the plasma generating apparatuses 303 and 301.

The difference between the plasma generating apparatuses 303 and 301 is that the plasma generating apparatus 303 includes RF power supply parts 370 and 380. The RF power supply part 370 supplies an RF power to an upper electrode 142. The RF power supply part 370 includes an RF source 371 and a source matcher 372. The RF power supply part 380 supplies an RF power to an edge inductive coil 344. The RF power supply part 380 includes an RF source 381 and a source matcher 382.

By means of the RF power supply parts 370 and 380, an amount of an electric current flowing in a center inductive coil 342 and an amount of an electric current flowing in the edge inductive coil 344 can be independently controlled, respectively. The RF power supply parts 370 and 380 may be also applied to the plasma generating apparatus 302 of FIG. 19.

Figure 23:
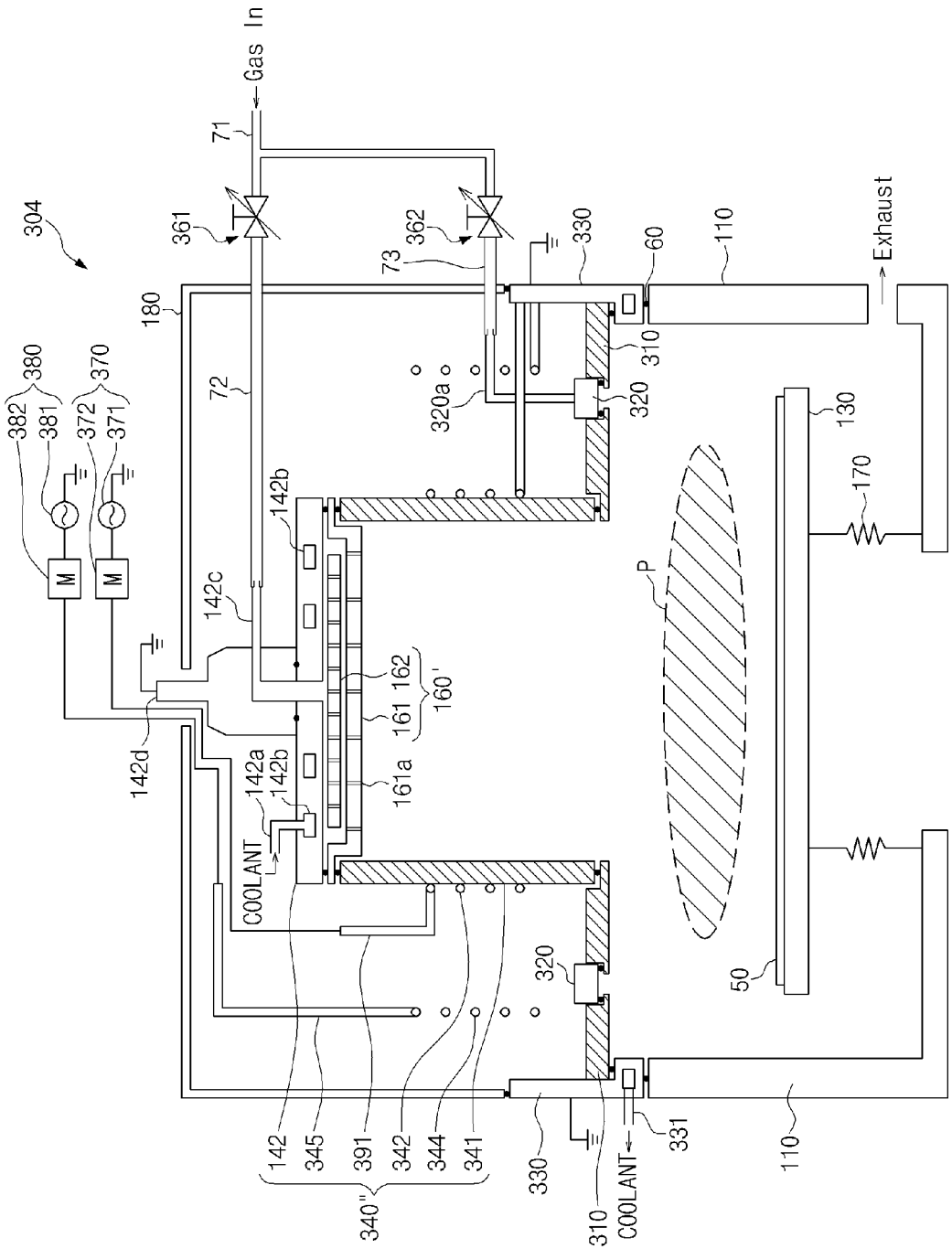
FIG. 23 is a schematic cross section of a plasma generating apparatus according to a seventh example embodiment.

FIG. 23 is a schematic cross section of a plasma generating apparatus according to a seventh example embodiment. A construction of the plasma generating apparatus 304 is the same as that of the plasma generating apparatus 303 described above with reference to FIG. 22. Also, the plasma generating apparatus 304 shows an operation performance and effect similar to those of the plasma generating apparatus 303.

To avoid the redundancy of description, in this example embodiment, a description is made centering on a difference between the plasma generating apparatuses 304 and 303.

The difference between the plasma generating apparatuses 304 and 303 is that a center conductive connector 391 included in a plasma source part 340" of the plasma generating apparatus 304 is separated from an upper electrode 142. This construction can reduce a phenomenon of plasma arcing due to high plasma potential.

Figure 24:
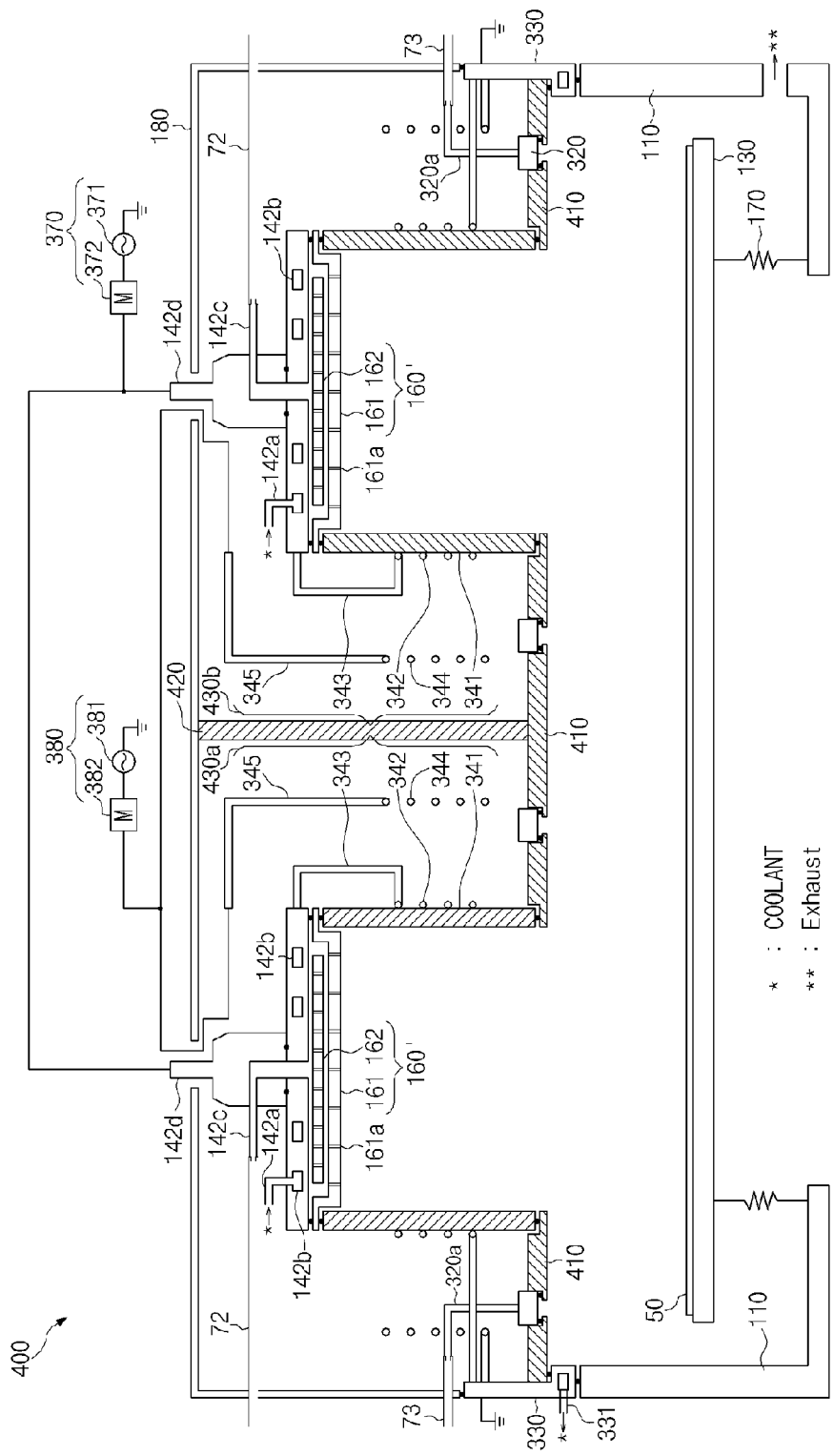
FIG. 24 is a schematic cross section of a plasma generating apparatus according to an eighth example embodiment.

FIG. 24 is a schematic cross section of a plasma generating apparatus according to an eighth example embodiment. A construction of the plasma generating apparatus 400 is the same as that of the plasma generating apparatus 303 described above with reference to FIG. 22 excepting one difference. Also, the plasma generating apparatus 400 shows an operation performance and effect similar to those of the plasma generating apparatus 303.

To avoid the redundancy of description, in this example embodiment, a description is made centering on a difference between the plasma generating apparatuses 400 and 303.

The difference between the plasma generating apparatuses 400 and 303 is that a dielectric part 410 of the plasma generating apparatus 400 has a plurality of through-holes, and a plurality of plasma source parts 430a and 430b are installed on the plurality of through-holes. An interference prevention part 420 is installed between the plurality of plasma source parts 430a and 430b. The interference prevention part 420 can be of materials such as a conductive metal, etc. The interference prevention part 420 is grounded and prevents interference between the plurality of plasma source parts 430a and 430b.

The plasma generating apparatus 400 can variously vary the distribution of an electric field formed within a vacuum chamber 110 by means of the plurality of plasma source parts 430a and 430b. Accordingly, the distribution of plasma can be uniformly or variously controlled within the vacuum chamber 110. Referring to FIGS. 27A to 27D, it can be appreciated that a density (D) of plasma is varied in accordance with a characteristic of a substrate 50 to be processed.

FIG. 24 illustrates the use of RF power supply parts 370 and 380 as a means for supplying an RF power to a center inductive coil 342 and an edge inductive coil 344, as one example. However, the plasma generating apparatus 400 may include the RF power supply part 350 of FIG. 14 in place of the RF power supply parts 370 and 380.

Figure 25:
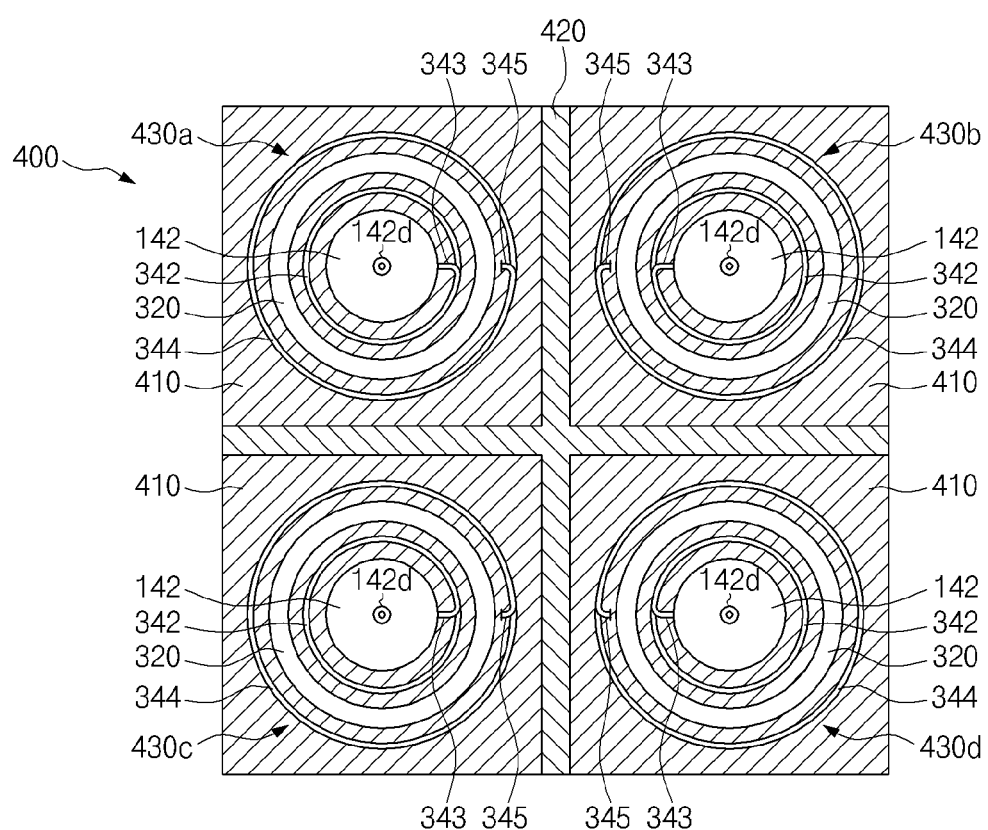
FIG. 25 is a plane diagram of a plasma generating apparatus in which a top of a cover is not shown, in an example in which an upper electrode of FIG. 24 is of a circle shape.

FIG. 25 is a plane diagram of the plasma generating apparatus in which a top of a cover 180 is not shown, in an example in which the upper electrode 142 of FIG. 24 is of a circle shape. The plasma generating apparatus 400 includes four plasma source parts 430a to 430d. An interference prevention part 420 is installed between the plasma source parts 430a to 430d.

Figure 26:
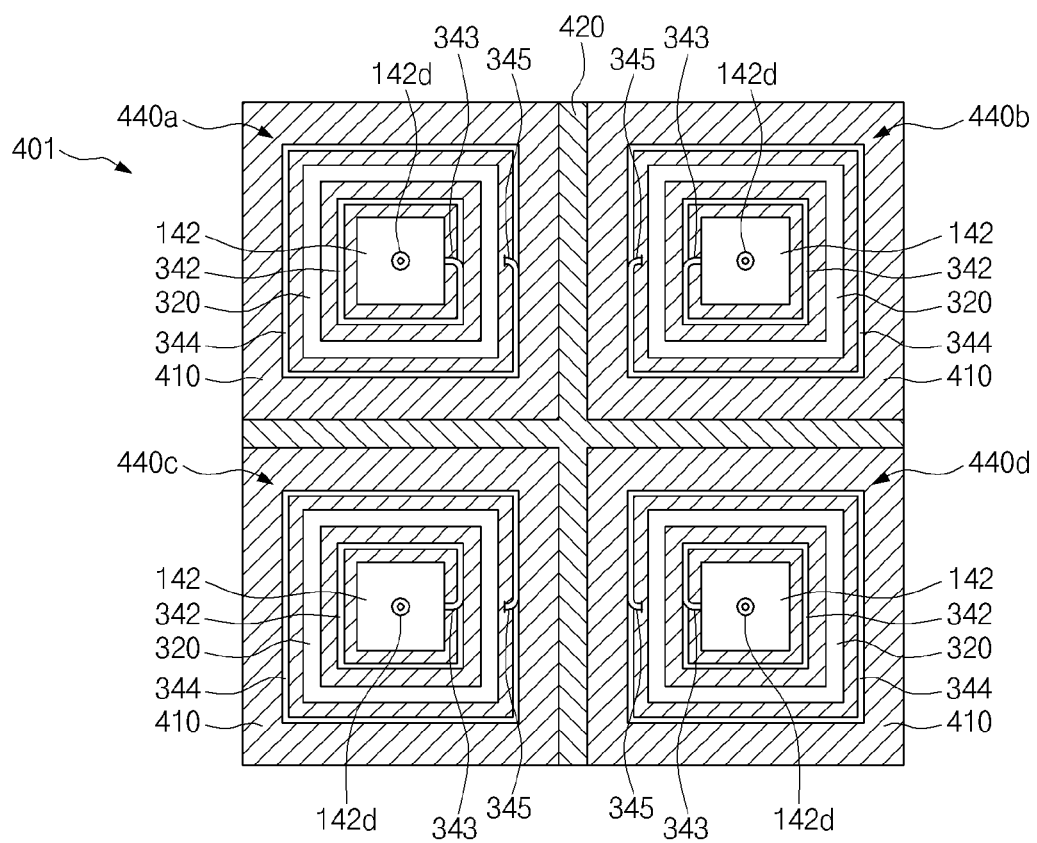
FIG. 26 is a plane diagram of a plasma generating apparatus in which a top of a cover is not shown, in an example in which an upper electrode of FIG. 24 is of a square shape.
Figure 27A:
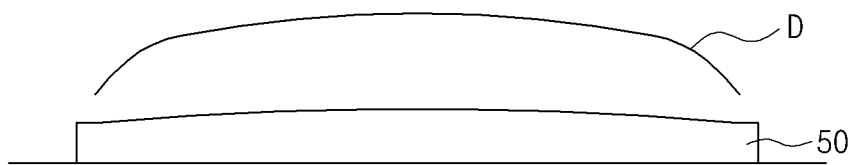
FIGS. 27A to 27D are diagrams illustrating a density of plasma formed on a target substrate within a vacuum chamber of a plasma generating apparatus according to an embodiment.
Figure 27B:
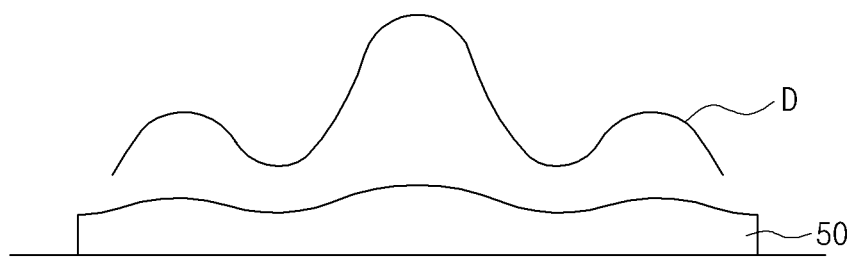
Figure 27C:
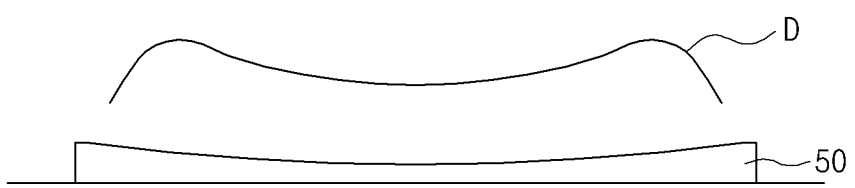
Figure 27D:
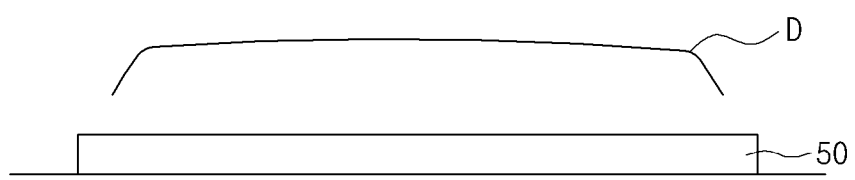

FIG. 26 is a plane diagram of the plasma generating apparatus in which a top of a cover 180 is not shown, in an example in which the upper electrode 142 of FIG. 24 is of a square shape. The plasma generating apparatus 401 includes four plasma source parts 440a to 440d. An interference prevention part 420 is installed between the plasma source parts 440a to 440d.

For the simplicity of drawings, FIGS. 25 and 26 omit an illustration of a part of an edge conductive connector 345.

FIGS. 24 to 26 illustrate the plasma generating apparatus 400 or 401 including the four plasma source parts 430a to 430d or 440a to 440d, as one example. However, this construction is not intended to limit the scope of embodiments. That is, the plasma source parts included in the plasma generating apparatus 400 can increase or decrease in number according to need. Also, an array form of the plasma source parts can change variously. On the other hand, a dielectric part 341 applied to the plasma generating apparatus 400 can be of any one of a square pipe shape, a cylinder shape, a cone shape, and a dome shape.

As described above, a plasma generating apparatus according to embodiments can uniformly or variously control the distribution of plasma, by diversely varying the distribution of an electric field formed within a vacuum chamber using an upper electrode and an inductive coil, or a center inductive coil and an edge inductive coil.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for generating plasma, the apparatus comprising: a vacuum chamber comprising a through-hole at a center of its top; and a plasma source part, comprising: a dielectric part configured to protrude upward along a circumference of the through-hole; an upper electrode coupled to seal an opened top of the dielectric part, the upper electrode configured to receive a supply of a Radio Frequency (RF) power; and an inductive coil configured to: spirally extend along an outer circumference surface of the dielectric part; and receive a supply of the RF power, the plasma source part being configured to generate plasma within the vacuum chamber, wherein the through-hole is provided in a partial region of an adaptor disposed below the dielectric part, a part of the vacuum chamber body comprising the adaptor, wherein: the adaptor further comprises at least one additional through-hole; and the apparatus further comprises: at least one additional plasma source part installed on the at least one additional through-hole, the at least one additional plasma source part comprising a same construction as the plasma source part; and a conductive interference prevention part configured to prevent interference between the plasma source parts.

2. The apparatus of claim 1, wherein the dielectric part comprises of any one of: a square pipe shape, a cylinder shape, a cone shape, and a dome shape.

3. An apparatus for generating plasma, the apparatus comprising:
   a vacuum chamber comprising a through-hole at its top; and
   a plasma source part, comprising:
      a dielectric part configured to protrude upward along a circumference of the through-hole;
      an upper electrode coupled to seal an opened top of the dielectric part, the upper electrode configured to receive a supply of a Radio Frequency (RF) power;
      an inductive coil configured to:
         spirally extend along an outer circumference surface of the dielectric part; and
         receive a supply of the RF power; and
      a conductive connector configured to electrically connect the upper electrode to one end of the inductive coil and
   to supply the RF power supplied to the upper electrode to the inductive coil, and
   the plasma source part being configured to generate plasma within the vacuum chamber.

4. The apparatus of claim 3, wherein the plasma source part further comprises:
   at least one additional inductive coil configured to spirally extend along an outer circumference surface of the dielectric part; and
   at least one additional conductive connector configured to electrically connect the upper electrode with one end of the at least one additional inductive coil.

5. The apparatus of claim 1, wherein:
   the upper electrode comprises a circular or polygonal plate shape antenna; and
   the through-hole comprises a shape corresponding to the upper electrode.

6. The apparatus of claim 1, further comprising an RF power supply part configured to supply the RF power to the upper electrode.

7. An apparatus for generating plasma, the apparatus comprising:
   a vacuum chamber opened at its top;

a first dielectric part comprising a through-hole in its partial region, the first dielectric part configured to cover the opened top of the vacuum chamber; and
a plasma source part comprising:
- a second dielectric part configured to protrude upward along a circumference of the through-hole;
- an upper electrode coupled to seal an opened top of the second dielectric part, the upper electrode configured to receive a supply of a Radio Frequency (RF) power;
- a center inductive coil configured to:
  - spirally extend along an outer circumference surface of the second dielectric part; and
  - receive a supply of the RF power; and
- an edge inductive coil configured to:
  - spirally extend along a circumference of the center inductive coil at a set distance from the center inductive coil; and
  - receive a supply of the RF power,
the plasma source part being configured to generate plasma within the vacuum chamber.

8. The apparatus of claim 7, wherein:
the first dielectric part further comprises at least one additional through-hole; and
the apparatus further comprises:
- at least one additional plasma source part installed on the at least one additional through-hole, the at least one additional plasma source part comprising a same construction as the plasma source part; and
- a conductive interference prevention part configured to prevent interference between the plasma source parts.

9. The apparatus of claim 7, wherein:
the plasma source part further comprises:
- a center conductive connector configured to electrically connect the upper electrode with one end of the center inductive coil; and
- an edge conductive connector configured to connect to one end of the edge inductive coil; and
the RF power supplied to the upper electrode is configured to be supplied to the center inductive coil through the center conductive connector.

10. The apparatus of claim 9, wherein the plasma source part further comprises:
at least one additional center inductive coil configured to spirally extend along an outer circumference surface of the second dielectric part;
at least one additional center conductive connector configured to electrically connect the upper electrode with one end of the at least one additional center inductive coil;
at least one additional edge inductive coil configured to spirally extend along a circumference of the at least one additional center inductive coil at a set distance from the center inductive coil; and
at least one additional edge conductive connector configured to connect to one end of the at least one additional edge inductive coil.

11. The apparatus of claim 8, wherein:
the upper electrode comprises a gas inlet configured to inject a gas;
the apparatus further comprises a center gas shower head installed below the upper electrode; and
the center gas shower head comprises:
- an inner gas distribution plate comprising a plurality of gas jet ports; and
- an inner gas diffusion plate disposed between the upper electrode and the inner gas distribution plate, the inner gas diffusion plate configured to uniformly diffuse the gas introduced through the gas inlet.

12. The apparatus of claim 11, wherein:
the first dielectric part comprises an opening in its partial region between the center inductive coil and the edge inductive coil, along a circumference of the second dielectric part;
the apparatus further comprises an edge gas shower head configured to cover the opening of the first dielectric part; and
the edge gas shower head comprises:
- a gas diffusion plate configured to uniformly diffuse a gas;
- a gas distribution plate formed in a "U" shape, the gas distribution plate configured to:
  - house the gas diffusion plate; and
  - jet the gas diffused by the gas diffusion plate into the vacuum chamber through a plurality of gas jet ports; and
- a cover comprising a gas inlet, the cover configured to cover a top of the gas distribution plate.

13. The apparatus of claim 12, further comprising:
a first gas controller configured to control an amount of gas introduced into the center gas shower head; and
a second gas controller configured to control an amount of gas introduced into the edge gas shower head.

14. The apparatus of claim 7, further comprising an RF power supply part configured to supply the RF power to the upper electrode and the edge inductive coil,
wherein the RF power supply part comprises:
- an RF source configured to generate an RF power,
- a source matcher connecting to an output of the RF source, the source matcher configured for impedance matching, and
- a variable capacitor configured to:
  - connect between a first output of the source matcher and an edge conductive connector, and
  - control an amount of an electric current flowing in the edge inductive coil connecting to the edge conductive connector, and
wherein a second output of the source matcher is configured to connect to an RF connection terminal of the upper electrode.

15. The apparatus of claim 7, further comprising:
a first RF power supply part configured to supply the RF power to the upper electrode; and
a second RF power supply part configured to supply the RF power to the edge inductive coil.

16. An apparatus for generating plasma, the apparatus comprising:
a vacuum chamber opened at its top;
a first dielectric part comprising a through-hole in its partial region, the first dielectric part configured to cover the opened top of the vacuum chamber; and
a plasma source part comprising:
- a second dielectric part configured to protrude upward along a circumference of the through-hole;
- an upper electrode coupled to seal an opened top of the second dielectric part and grounded;
- a center inductive coil configured to:
  - spirally extend along an outer circumference surface of the second dielectric part; and
  - receive a supply of a Radio Frequency (RF) power; and
- an edge inductive coil configured to:
  - spirally extend along a circumference of the center inductive coil at a set distance from the center inductive coil; and
  - receive a supply of the RF power, the plasma source part being configured to generate plasma within the vacuum chamber.

17. The apparatus of claim 16, wherein:
the plasma source part further comprises:
   a center conductive connector configured to connect to one end of the center inductive coil; and
   an edge conductive connector configured to connect to one end of the edge inductive coil; and
the center inductive coil is grounded through the center conductive connector.

18. The apparatus of claim 3, wherein the conductive connector directly electrically conduct the upper electrode to the inductive coil such that the RF power supplied to the upper electrode and the RF power supplied to the inductive coil through the upper electrode are in same phase.

* * * * *